United States Patent
Zhang et al.

(10) Patent No.: US 9,850,717 B2
(45) Date of Patent: Dec. 26, 2017

(54) METHODS FOR DESIGNING FIXED CUTTER BITS AND BITS MADE USING SUCH METHODS

(71) Applicant: Smith International, Inc., Houston, TX (US)

(72) Inventors: Zhehua Zhang, The Woodlands, TX (US); Jiaqing Yu, Conroe, TX (US)

(73) Assignee: SMITH INTERNATIONAL, INC., Houston, TX (US)

( * ) Notice: Subject to any disclaimer, the term of this patent is extended or adjusted under 35 U.S.C. 154(b) by 739 days.

(21) Appl. No.: 14/057,601

(22) Filed: Oct. 18, 2013

(65) Prior Publication Data
US 2014/0110181 A1    Apr. 24, 2014

Related U.S. Application Data

(60) Provisional application No. 61/717,012, filed on Oct. 22, 2012.

(51) Int. Cl.
| | | |
|---|---|---|
| G06G 7/48 | (2006.01) | |
| E21B 10/55 | (2006.01) | |
| E21B 10/567 | (2006.01) | |
| G06F 17/50 | (2006.01) | |

(52) U.S. Cl.
CPC ............ *E21B 10/55* (2013.01); *E21B 10/567* (2013.01); *G06F 17/5018* (2013.01)

(58) Field of Classification Search
None
See application file for complete search history.

(56) References Cited

U.S. PATENT DOCUMENTS

| | | | |
|---|---|---|---|
| 4,815,342 A | | 3/1989 | Brett et al. |
| 5,787,022 A | * | 7/1998 | Tibbitts .................. E21B 10/43 702/12 |
| 6,213,225 B1 | * | 4/2001 | Chen ...................... E21B 10/08 175/331 |
| 6,389,360 B1 | * | 5/2002 | Alft .......................... E21B 7/04 702/9 |
| 2004/0230413 A1 | * | 11/2004 | Chen ...................... E21B 10/08 703/10 |
| 2006/0162968 A1 | * | 7/2006 | Durairajan ............. E21B 10/43 175/431 |
| 2007/0032958 A1 | * | 2/2007 | Chen ........................ E21B 7/04 702/14 |
| 2007/0078632 A1 | * | 4/2007 | Shen ..................... E21B 10/43 703/1 |

(Continued)

OTHER PUBLICATIONS

Lenamond, Chris, et al. "Performance gains for rotary steerable through specialized bit design." AADE National Technical Conference and Exhibition, Houston, AADE. 2005.*

(Continued)

*Primary Examiner* — Omar Fernandez Rivas
*Assistant Examiner* — Nithya J Moll

(57) ABSTRACT

Embodiments disclosed herein relate to a method for analyzing a fixed cutter drill bit, said method including selecting a cutter; selecting an earth formation; simulating drilling performance of the fixed cutter bit having at least once cutter thereon; performing finite element analysis using outputs from the simulating; and outputting stress on the at least one cutter.

14 Claims, 43 Drawing Sheets

(56) References Cited

U.S. PATENT DOCUMENTS

| | | | |
|---|---|---|---|
| 2011/0035200 A1* | 2/2011 | Huang | E21B 10/00 |
| | | | 703/6 |
| 2011/0213602 A1* | 9/2011 | Dasari | E21B 43/00 |
| | | | 703/10 |
| 2011/0240376 A1* | 10/2011 | Chen | E21B 10/43 |
| | | | 175/336 |
| 2012/0016589 A1* | 1/2012 | Li | E21B 47/0006 |
| | | | 702/9 |
| 2013/0068534 A1* | 3/2013 | DiGiovanni | E21B 10/5673 |
| | | | 175/428 |

OTHER PUBLICATIONS

Perrin, V. P., Graham Mensa-Wilmot, and W. L. Alexander. "Drilling index—a new approach to bit performance evaluation." SPE/IADC drilling conference. Society of Petroleum Engineers, 1997.*

Fear, M. J., N. C. Meany, and J. M. Evans. "An expert system for drill bit selection." SPE/IADC Drilling Conference. Society of Petroleum Engineers, 1994.*

Menand, Stephane, et al. "How the bit profile and gages affect the well trajectory." IADC/SPE Drilling Conference. Society of Petroleum Engineers, 2002.*

Glowka, David, "Development of a Method for Predicting the Performance and Wear of PDC drill Bits", Sandia Report No. SAN86-1745, Sep. 1987, 206 pages.

* cited by examiner

METHODS FOR DESIGNING FIXED CUTTER BITS AND BITS MADE USING SUCH METHODS

CROSS-REFERENCE TO RELATED APPLICATIONS

This application claims priority to and the benefit of U.S. Patent Application No. 61/717,012, filed on Oct. 22, 2012, which is herein incorporated by reference in its entirety.

BACKGROUND OF THE DISCLOSURE

Fixed cutter bits, such as PDC drill bits, are commonly used in the oil and gas industry to drill well bores. One example of a conventional drilling system for drilling boreholes in subsurface earth formations is shown in FIG. 1. This drilling system includes a drilling rig 10 used to turn a drill string 12 which extends downward into a well bore 14. Connected to the end of the drill string 12 is a fixed cutter drill bit 20.

As shown in FIG. 2, a fixed cutter drill bit 20 typically includes a bit body 22 having an externally threaded connection at one end 24, and a plurality of blades 26 extending, from the other end of bit body 22 and forming the cutting surface of the bit 20. A plurality of cutters 28 are attached to each of the blades 26 and extend from the blades to cut through earth formations when the bit 20 is rotated during drilling. The cutters 28 deform the earth formation by scraping and shearing. The cutters 28 may be tungsten carbide inserts, polycrystalline diamond compacts, milled steel teeth, or any other cutting elements of materials hard and strong enough to deform or cut through the formation. Hardfacing (not shown) may also be applied to the cutters 28 and other portions of the bit 20 to reduce wear on the bit 20 and to increase the life of the bit 20 as the bit 20 cuts through earth formations.

Significant expense is involved in the design and manufacture of drill bits and in the drilling of well bores. Having accurate models for predicting and analyzing drilling characteristics of bits can greatly reduce the cost associated with manufacturing drill bits and designing drilling operations because these models can be used to more accurately predict the performance of bits prior to their manufacture and/or use for a particular drilling application. For these reasons, models have been developed and employed for the analysis and design of fixed cutter drill bits.

SUMMARY OF THE DISCLOSURE

In one aspect, embodiments disclosed herein relate to a method for analyzing a fixed cutter drill bit, said method including, selecting at least one cutter; selecting an earth formation; simulating drilling performance of the fixed cutter bit having the at least one cutter thereon: performing finite element analysis using outputs from the simulating; and outputting stress on the at least one cutter.

In another aspect, embodiments disclosed herein relate to a method for designing a fixed cutter drill bit, said method including selecting bit design parameters; selecting an earth formation; selecting drilling parameters; simulating drilling, performance of the fixed cutter bit having at least one cutter thereon; performing finite element analysis using outputs from the simulating; and outputting stress on the at least one cutter.

In another aspect, embodiments disclosed herein relate to a drill bit for use in a drilling assembly, said drill hit including a bit body having a rotational axis extending therethrough; a plurality of cutting blades extending, radially from the rotational axis and extending axially, the plurality of cutting blades comprising cutting elements disposed thereon; wherein each cutting element is configured to balance force distribution resulting from bit and earth formation interferences based on finite element analysis results.

Other aspects and advantages of the disclosure will be apparent from the following description, figures, and the appended claims.

DETAILED DESCRIPTION

Figure 1:
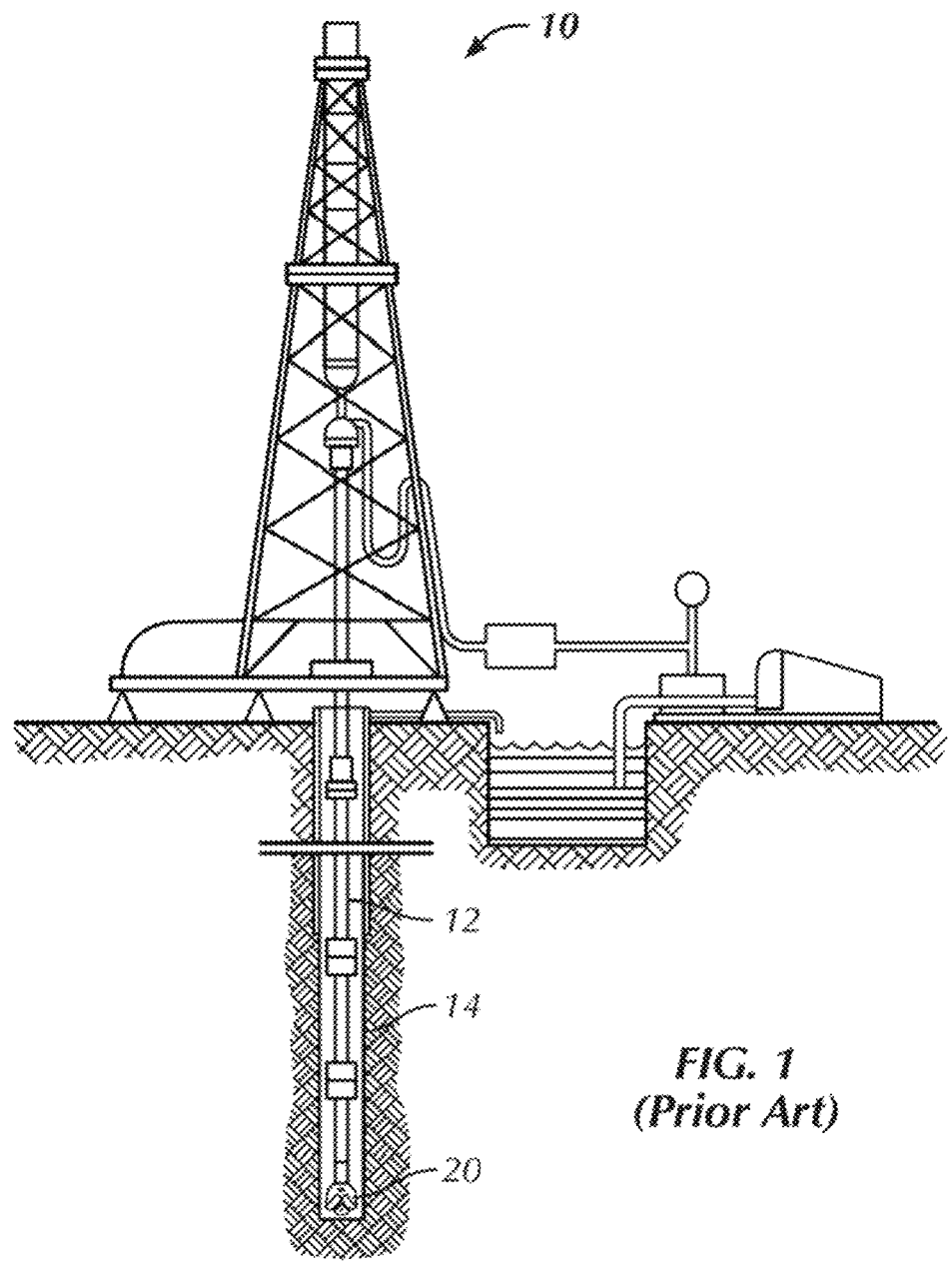
FIG. 1 shows a schematic diagram of a conventional drilling system which includes a drill string having a fixed cutter drill bit attached at one end for drilling bore holes through subterranean earth formations.
Figure 2:
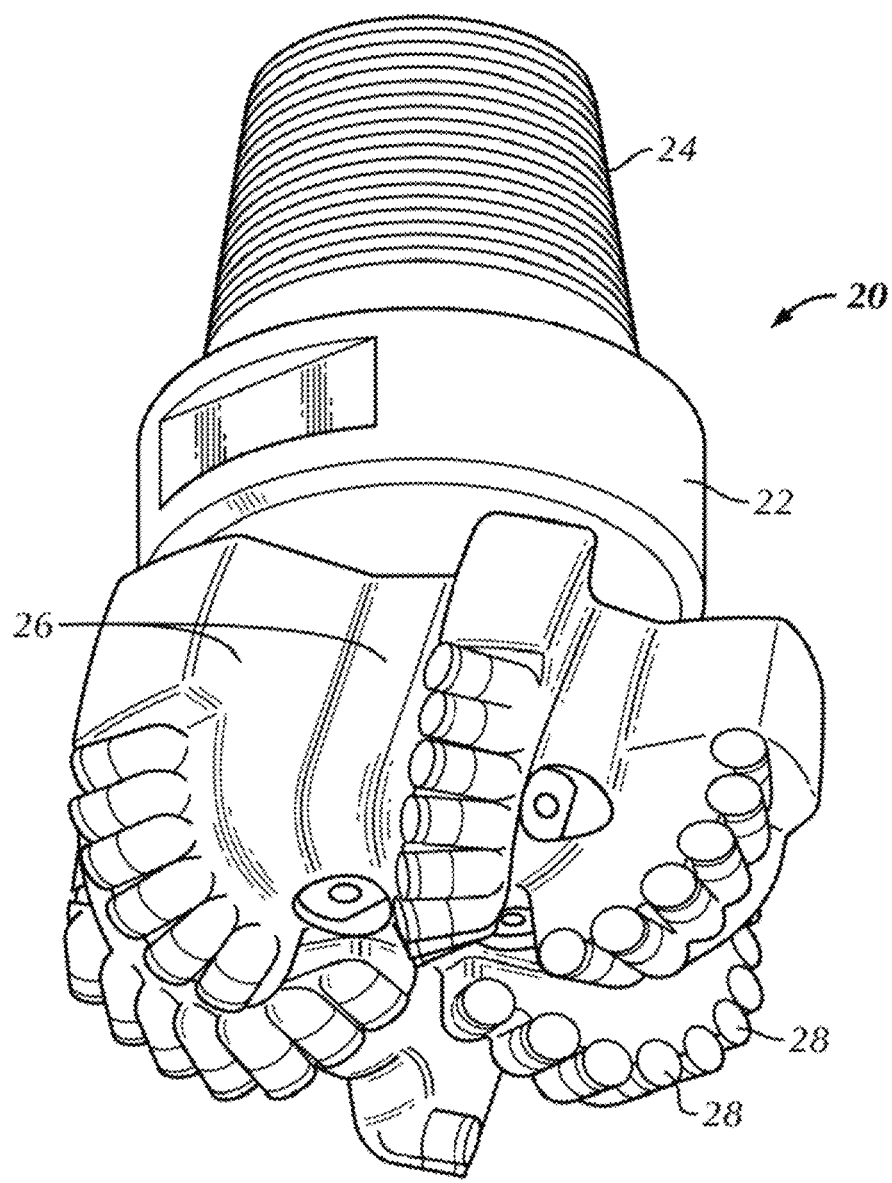
FIG. 2 shows a perspective view of a prior art fixed cutter drill bit.

The present disclosure provides methods for modeling the performance of fixed cutter bits drilling earth formations. In one aspect, a method takes into account actual interactions between cutters and earth formations during drilling. Methods in accordance with one or more embodiments of the disclosure may be used to design fixed cutter drill bits, to optimize the performance of bits, to optimize the response of an entire drill string during drilling, or to generate visual displays of drilling.

In accordance with one aspect of the present disclosure, one or more embodiments of a method for modeling the dynamic performance of a fixed cutter bit drilling earth formations includes selecting a drill bit design and an earth formation to be represented as drilled, wherein a geometric model of the bit and a geometric model of the earth formation to be represented as drilled are generated. The method also includes incrementally rotating the bit on the formation and calculating the interaction between the cutters on the bit and the earth formation during the incremental rotation. The method further includes determining the forces on the cutters during the incremental rotation based on data from a cutter/formation interaction model and the calculated interaction between the bit and the earth formation.

The cutter formation interaction model may comprise empirical data obtained from cutter/formation interaction tests conducted for one or more cutters on one or more different formations in one or more different orientations. In alternative embodiments, the data from the cutter/formation interaction model is obtained from a numerical model developed to characterize the cutting relationship between a selected cutter and a selected earth formation. In one or more embodiments, the method described above is embodied in a computer program and the program also includes subroutines for generating a visual displays representative of the performance of the fixed cutter drill bit drilling earth formations.

In designing cutters and drill bits in accordance with embodiments disclosed herein, a method including finite element, analysis ("TEA") may be used to yield more accurate results than mere simulation techniques alone. This FEA method, provided after a simulation analysis as described below, may more accurately calculate forces acting on cutters because it is tailored to determine the stresses on various cutters. Suitable software to perform such FEA includes, but is not limited to, ABAQUS (available from ABAQUS, Inc.), MARC (available from MSC Software Corporation), and ANSYS (available from ANSYS. Inc.).

Specifically, embodiments and methods disclosed herein may advantageously provide techniques for generating and analyzing cutter geometries, locations, and other in formation within FEA to determine the cutters response under drilling conditions.

Modeling the Performance of Fixed Cutter Bits

In one or more embodiments of the disclosure, forces acting on a cutter on a bit, such as during the simulation of a bit drilling earth formation is determined using cutter/formation interaction data.

Figure 3:
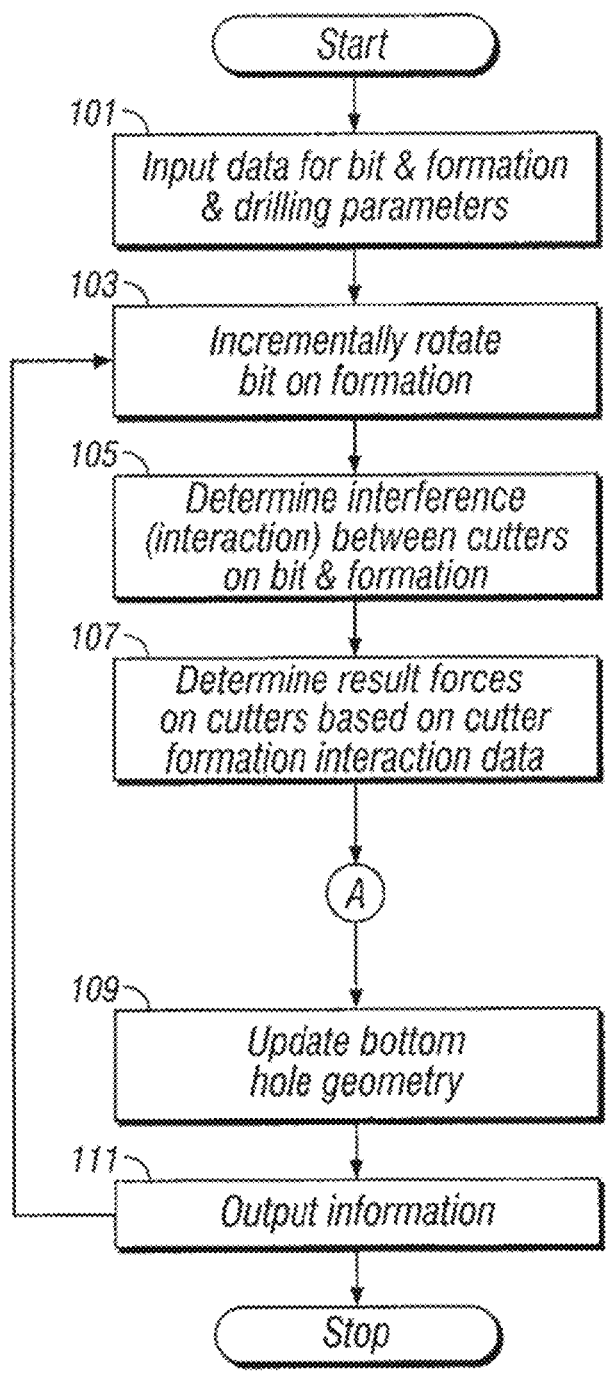
FIG. 3 shows a flowchart of a method for modeling, the performance of a fixed cutter bit during drilling in accordance with one or more embodiments of the disclosure.

One example of a method that may be used to model a fixed cutter drill bit drilling earth formation is illustrated in FIG. 3. In this embodiment, the method includes accepting as input parameters for a bit, an earth formation to be drilled, and drilling parameters, 101. The method generates a numerical representation of the bit and a numerical representation of the earth formation and simulates the bit drilling in the earth formation by incrementally rotating the bit (numerically) on the formation, 103. The interference between the cutters on the bit and the earth formation during the incremental rotation are determined, 105, and the forces on the cutters resulting from the interference are determined, 107. Finally, the bottomhole geometry is updated to remove the limitation cut by the cutters, as a result of the interference, during the incremental rotation, 109. Results determined during the incremental rotation are output, 111. The steps of incrementally rotating 103, calculating 105, determining 107, and updating 109 are repeated to simulate the drill bit drilling through earth formations with results determined for each incremental rotation being provided, as output 111.

Figure 3A:
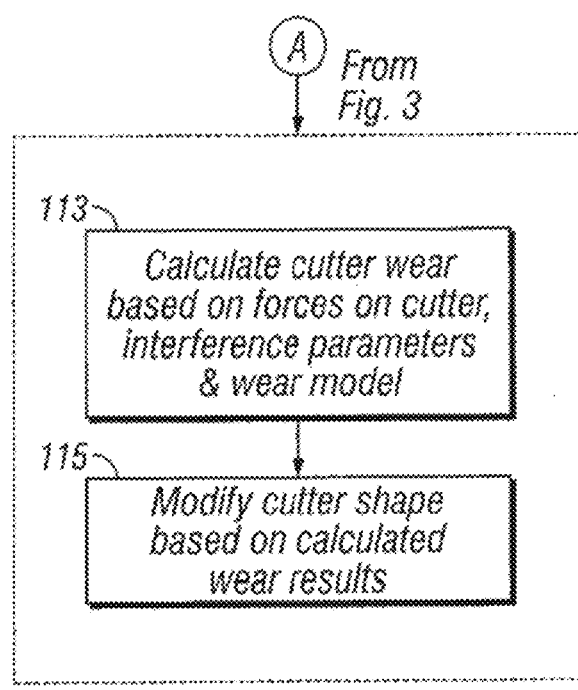
FIG. 3A shows additional method steps that may be included in the method shown in FIG. 3 to model wear on the cutters of the fixed cutter bit during drilling in accordance with one or more embodiments of the disclosure.

As illustrated in FIG. 3A, for each incremental rotation the method may further include calculating cutter wear based on forces on the cutters, the interference of the cutters with the formation, and a wear model 113, and modifying cutter shapes based on the calculated cutter wear 115. These steps may be inserted into the method at the point indicated by the node labeled "A".

Further, those having ordinary skill will appreciate that the work done by the bit and/or individual cutters may be determined. Work is equal to force times distance, and because embodiments of the simulation provide information about the force acting on a cutter and the distance into the formation that a cutter penetrates, the work done by a cutter may be determined.

Figure 4A:
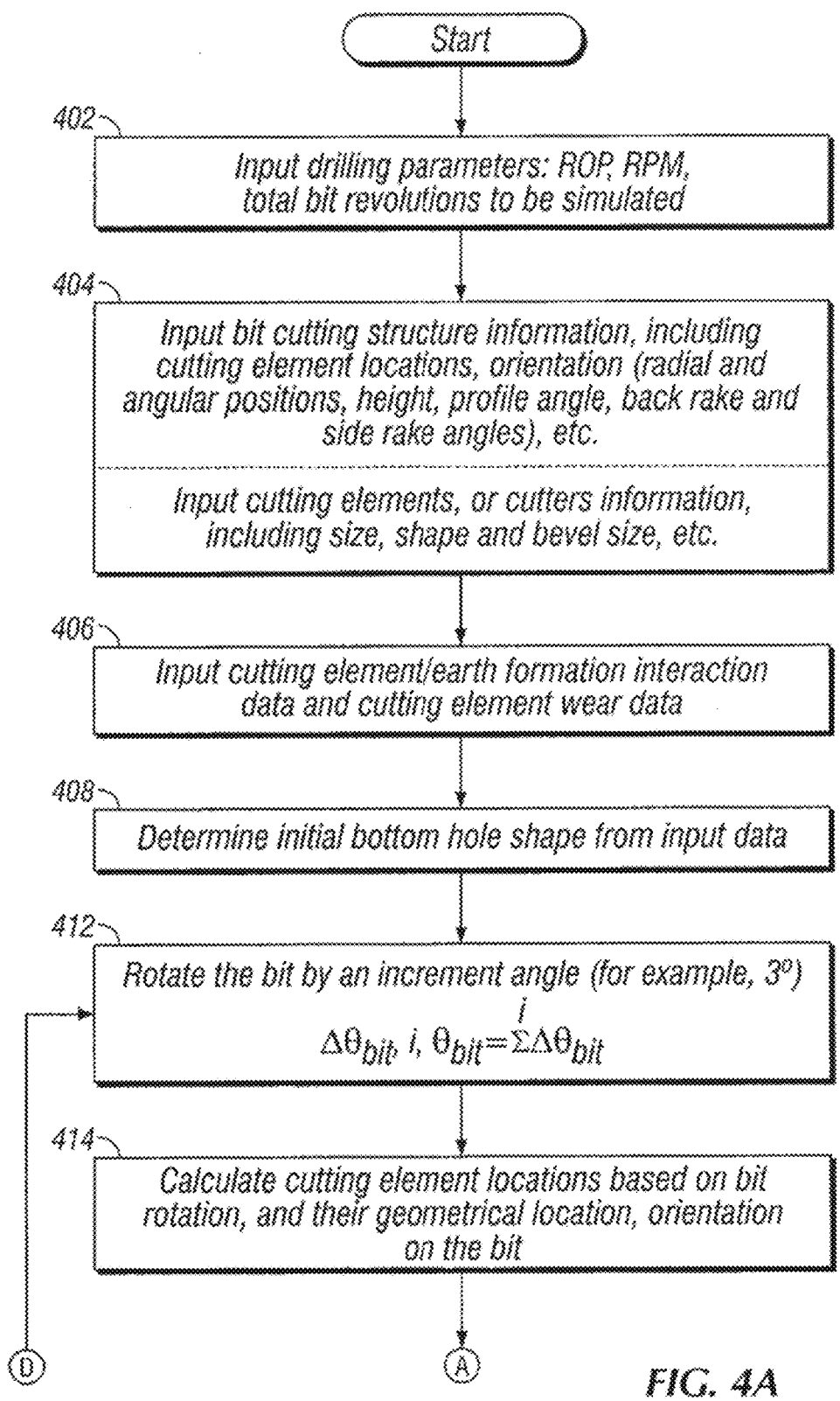
FIGS. 4A-4C show a flowchart of a method for modeling the drilling performance of a fixed cutter bit in accordance with one embodiment of the disclosure.
Figure 4B:
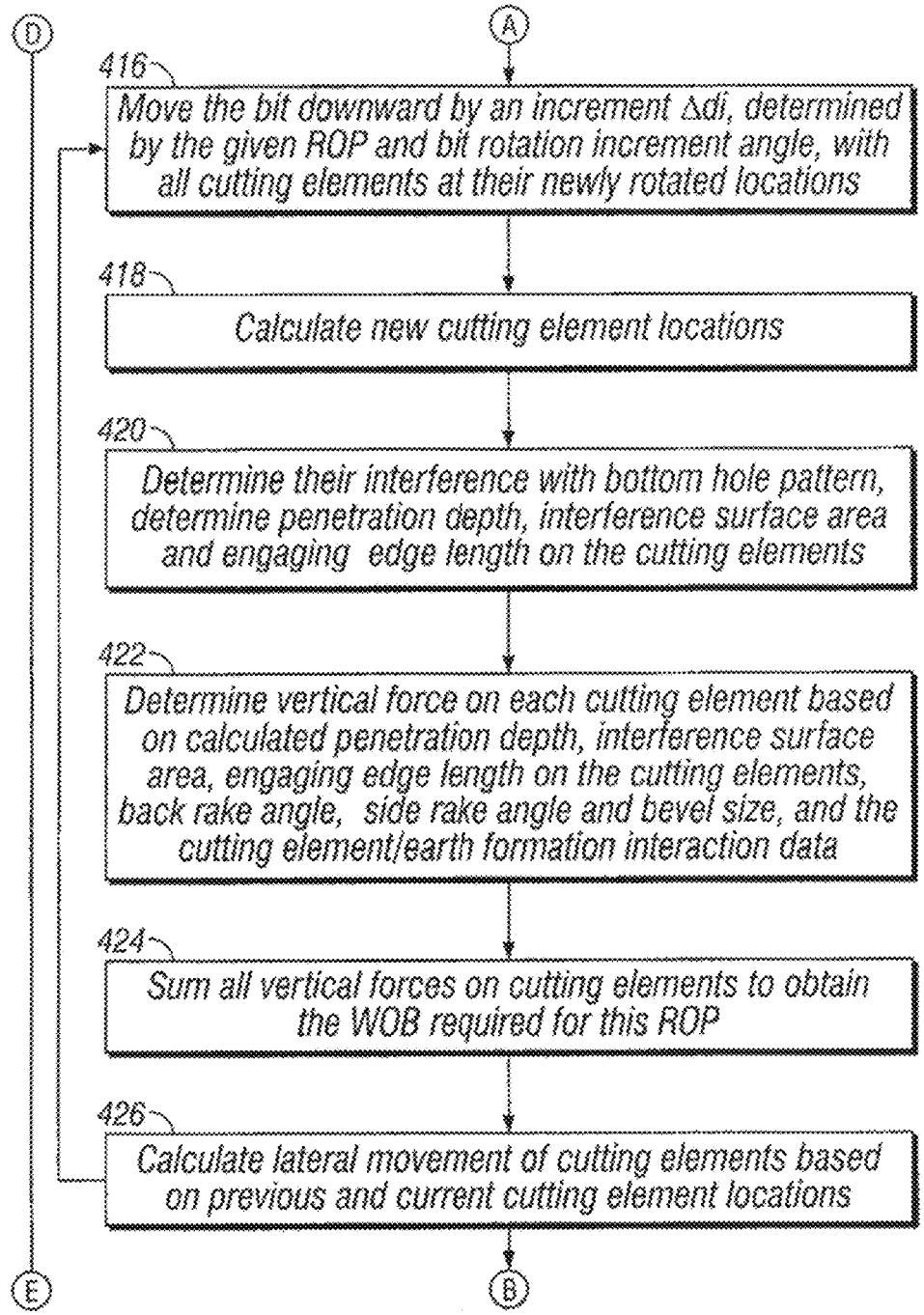
Figure 4C:
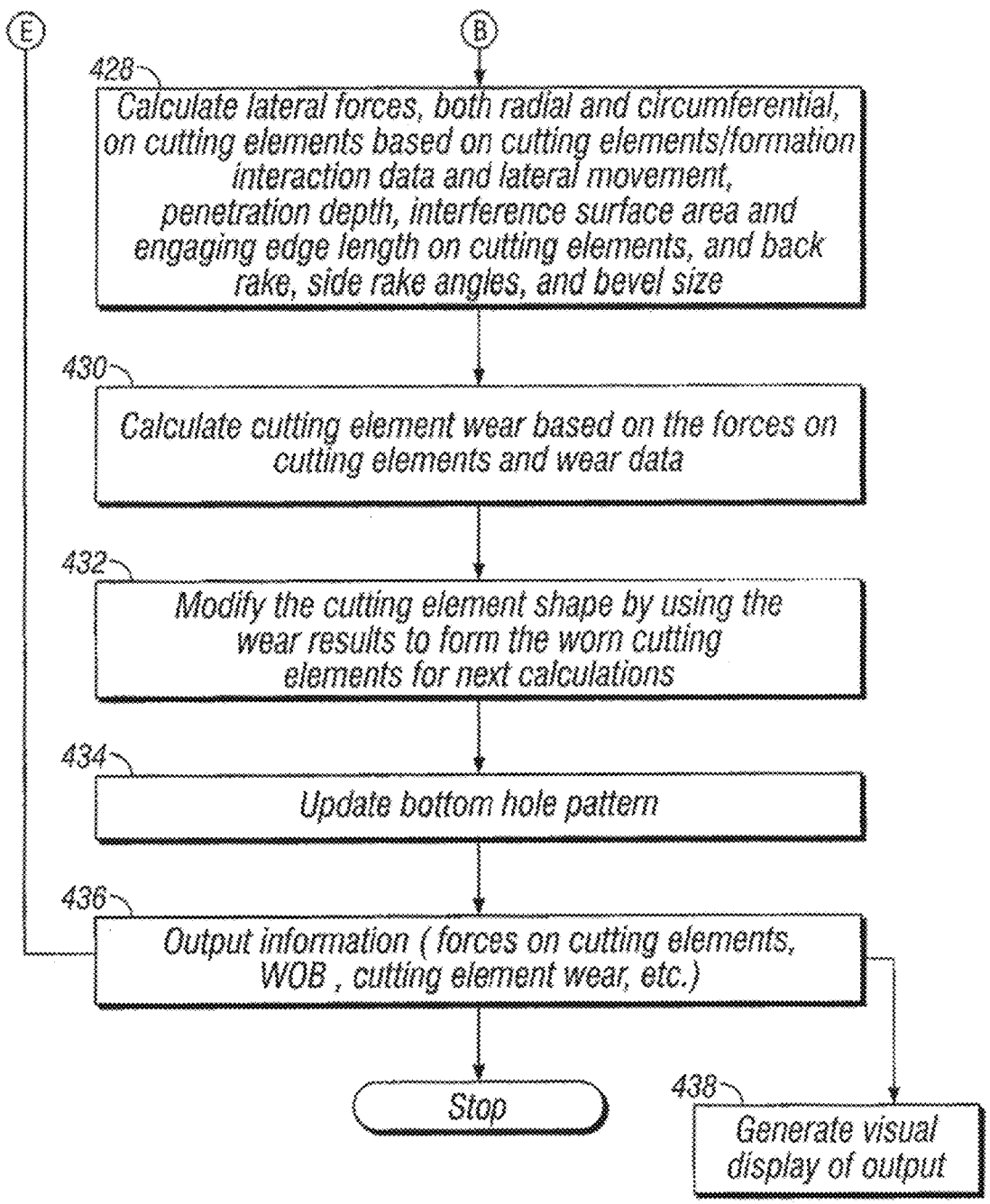

A flowchart for one implementation of a method developed in accordance with this aspect of the disclosure is shown, for example, in FIGS. 4A-4C. This method was developed to model drilling based on ROP control. As shown in 4A, the method includes selecting or otherwise inputting parameters for a dynamic simulation. Parameters provided as input include drilling parameters 402, bit design parameters 404, cutter/formation interaction data and cutter wear data 406, and bottomhole parameters for determining the initial bottomhole shape at 408. The data and parameters provided as input for the simulation can be stored in an input library and retrieved as need during simulation calculations.

Drilling parameters 402 may include any parameters that can be used to characterize drilling. In the method shown, the drilling parameters 402 provided as input include the rate of penetration (ROP) and the rotation speed of the drill bit (revolutions per minute, RPM). Those having ordinary skill in the art would recognize that other parameters weight on bit, mud weight, e.g.) may be included.

Bit design parameters 404 may include any parameters that can be used to characterize a bit design. In the method shown, bit design parameters 404 provided as input include the cutter locations and orientations (e.g., radial and angular positions, heights, profile angles, back rake angles, side rake angles, etc.) and the cutter sizes (e.g., diameter), shapes (i.e., geometry) and bevel size. Additional bit design parameters 404 may include the bit profile, bit diameter, number of blades on bit, blade geometries, blade locations, junk, slot areas, hit axial offset (from the axis of rotation), cutter material make-up (e.g., tungsten carbide substrate with hardfacing overlay of selected thickness), etc. Those skilled in the art will appreciate that cutter geometries and the bit geometry can be meshed, converted to coordinates and provided as numerical input. Example methods for obtaining bit design parameters 404 for use in a simulation include the use of 3-dimensional CAD solid or surface models for a bit to facilitate geometric input.

Cutter/formation interaction data 406 includes data obtained from experimental tests or numerically simulations of experimental tests which characterize the actual interactions between selected cutters and selected earth formations, as previously described in detail above. Wear data 406 may be data generated using any wear model known in the art or may be data obtained from cutter/formation interaction tests that included an observation and recording of the wear of the cutters during the test. A wear model may comprise a mathematical model that can be used to calculate an amount of wear on the cutter surface based on forces on the cutter during drilling or experimental data which characterizes wear on a given cutter as it cuts though the selected earth formation.

Bottomhole parameters used to determine the bottomhole shape at 408 may include any information or data that can be used to characterize the initial geometry of the bottomhole surface of the well bore. The initial bottomhole geometry may be considered as a planar surface, but this is not a limitation on the disclosure. Those skilled in the art will appreciate that the geometry of the hottomhole surface can be meshed, represented by a set of spatial coordinates, and provided as input. In one implementation, a visual representation of the bottomhole surface is generated using a coordinate mesh size of 1 millimeter.

Once the input data (402, 404, 406) is entered or otherwise made available and the bottomhole shape determined (at 408), the steps in a main simulation loop 410 can be executed. Within the main simulation loop 410, drilling is simulated by "rotating" the bit (numerically) by an incremental amount, $\Delta\theta_{bit\,j}$, 412. The rotated position of the hit at any time can be expressed as $$\theta_{bit} = \sum^{i} \Delta\theta_{bit,i},$$

412. $\Delta\theta_{bit\,j}$ may be set equal to 3 degrees, for example. In other implementations, $\Delta\theta_{bit\,j}$ may be function of time or may be calculated for each given time step. The new location of each of the cutters is then calculated, 414, based on the known incremental rotation of the bit, $\Delta\theta_{bit\,j}$, and the known previous location of each of the cutters on the bit. At this step, 414, the new cutter locations only reflect the change in the cutter locations based on the incremental rotation of the bit. The newly rotated location of the cutters can be determined by geometric calculations known in the art.

As shown at the top of FIG. 4B, the axial displacement of the bit, $\Delta d_{bit\,j}$, during the incremental rotation is then determined, 416. In this implementation the rate of penetration (ROP) was provided as input data (at 402), therefore axial displacement of the bit is calculated based on the given ROP and the known incremental rotation angle of the bit. The axial displacement can be determined by geometric calculations known in the art. For example, if ROP is given in fair and rotation speed of the bit is given in revolutions per minute (RPM), the axial displacement, $\Delta d_{bit\,j}$, of the bit resulting for the incremental rotation, $\Delta\theta_{bit\,j}$, may be determined using an equation such as:

$$\Delta d_{bit,i} = \frac{(ROP_i/RPM_i)}{60} \cdot (\Delta\theta_{bit,i}).$$

Once the axial displacement of the bit, $\Delta d_{bit\,j}$, is determined, the hit is "moved" axially downward (numerically) by the incremental distance, $\Delta d_{bit\,j}$, 416 (with the cutters at their newly rotated locations calculated at 414). Then the new location of each of the cutters after the axial displacement is calculated 418. The calculated location of the cutters now reflects the incremental rotation and axial displacement of the bit during the "increment of drilling". Then each cutter interference with the bottomhole is determined, 420. Determining cutter interaction with the bottomhole includes calculating the depth of cut, the interference surface area, and the contact edge length for each cutter contacting the formation during the increment of drilling by the bit. These cutter/formation interaction parameters can be calculated using geometrical calculations known in the art.

Figure 5:
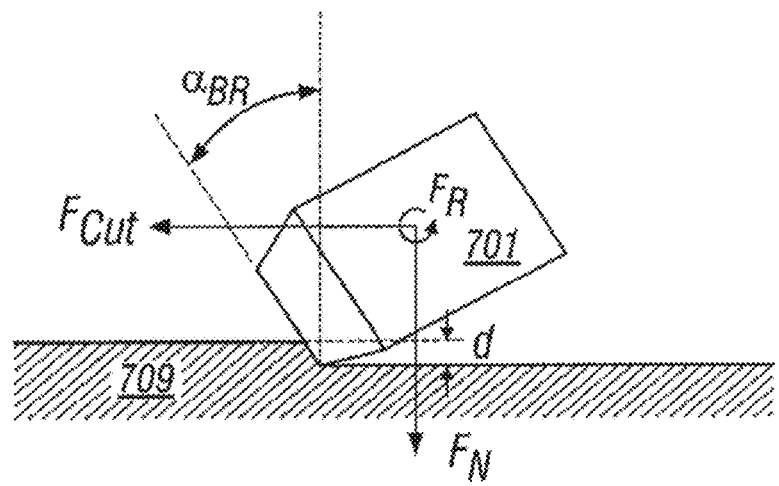
FIG. 5 shows an example of a force required on a cutter to cut through an earth formation being resolved into components in a Cartesian coordinate system along with corresponding parameters that can be used to describe cutter/formation interaction during drilling.
Figure 5A:
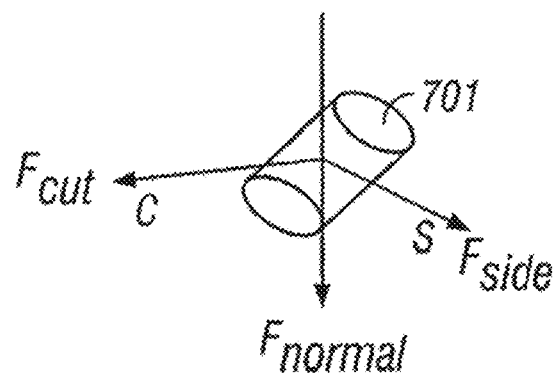
FIGS. 5A and 5B show a perspective view and a top view of the cutter illustrated in FIG. 5.
Figure 5B:
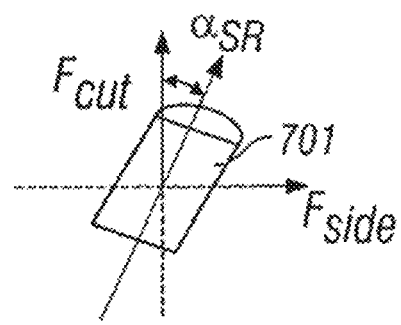
Figure 6A:
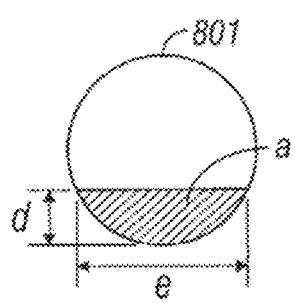
FIGS. 6A and 7A show examples of a cutter of a fixed cutter hit and the cutting area of interference between the cutter and the earth formation.
Figure 6B:
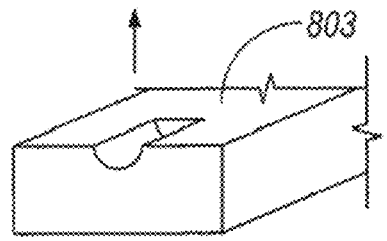
FIGS. 6B and 7B show examples of the cuts formed in the earth formation by the cutters illustrated in FIGS. 8A and 9A, respectively.

The total force required on the cutter to cut through earth formation can be resolved into components in any selected coordinate system, such as the Cartesian coordinate system shown in FIGS. 5, 5A, and 5B. As shown in FIGS. 5 and 5A, the force on the cutter can be resolved into a normal component (normal force), $F_N$, a cutting direction component (cut force), $f_{cut}$, and a side component (side force), $F_{side}$. In the cutter coordinate system shown in FIG. 5, the cutting axis is positioned along, the direction of cut. The normal axis is normal to the direction of cut and generally perpendicular to the surface of the earth formation 709 interacting with the cutter. The side axis is parallel to the surface of the earth formation 709 and perpendicular to the cutting axis. The origin of this cutter coordinate system is shown positioned at the center of the cutter 701.

Figure 8:
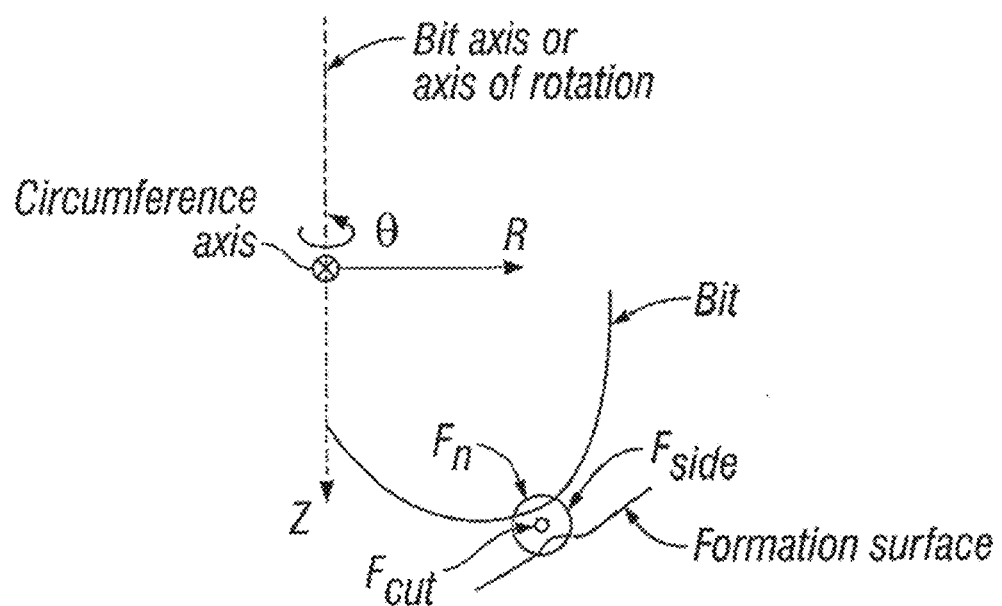
FIG. 8 shows one example of a bit coordinate system showing cutter forces on a cutter of a bit in the bit coordinate system.

Once the correct cutter/formation interaction parameters are determined, the axial force on each cutter (in the Z direction with respect to a bit coordinate system as illustrated in FIG. 8) during increment drilling step, i, is determined, 422. The force on each cutter is determined from the cutter/formation interaction data based on the calculated values for the cutter/formation interaction parameters and cutter and formation information.

Referring to FIG. 8, the normal force, cutting force, and side force on each cutter is determined from cutter/formation interaction data based on the known cutter information (cutter type, size, shape, bevel size, etc.), the selected formation type, the calculated interference parameters (i.e., interference surface area, depth of cut, contact edge length) and the cutter orientation parameters (i.e., back rake angle, side rake angle, etc.). For example, the forces are determined by accessing cutter/formation interaction data for a cutter and formation pair similar to the cutter and earth formation interacting during drilling. Then the values calculated for the interaction parameters (depth of cut, interference surface area, contact edge length, back rack, side rake, and bevel size) during drilling are used to determine the forces required on the cutter to cut through formation in the cutter/formation interaction data. If values for the interaction parameters do not match values contained in the cutter/formation interaction data, records containing the most similar parameters are used and values for these most similar records are used to interpolate the force required on the cutting element during drilling.

Figure 7A:
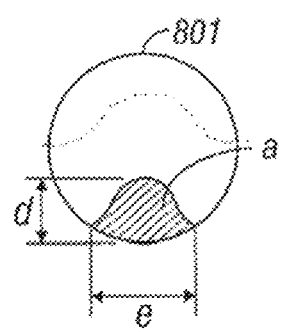
Figure 7B:
Figure 7C:
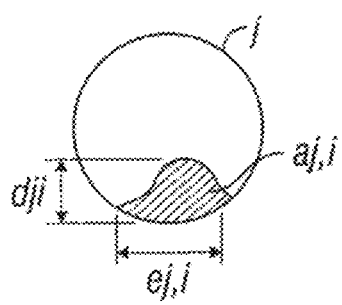
FIG. 7C shows one example partial cutter contact with formation and cutter/formation interaction parameters calculated during drilling being converted to equivalent interaction parameters to correspond to cutter/formation interaction data.
Figure 7C:
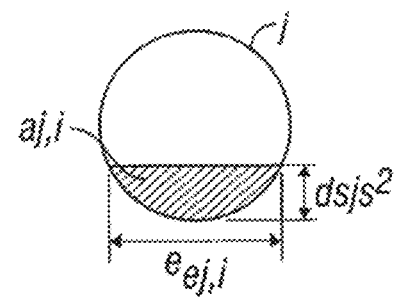

In cases during drilling wherein the cutting element makes less than full contact with the earth formation due to grooves in the formation surf made by previous contact with cutters, illustrated in FIGS. 7A and 7B, an equivalent depth of cut and an equivalent contact edge length can be calculated to correspond to the interference surface area, as shown in FIG. 7C, and used to determine the force required on the cutting element during drilling.

In one implementation, an equivalent contact edge length, $e_{e|j,i}$ and an equivalent depth of cut, $d_{e|j,i}$, are calculated to correspond to the interference surface area, $a_{j,i}$, calculated for cutters in contact with the formation, as shown in FIG. 7C. Those skilled in the art will appreciate that during calculations each cutter may be considered as a collection of meshed elements and the parameters above obtained for each element in the mesh. The parameter values for each element can be used to obtain the equivalent contact edge length and the equivalent depth of cut. For example, the element values can be summed and an average taken as the equivalent contact edge length and the equivalent depth of cut for the cutter that corresponds to the calculated interference surface area. The above calculations can be carried out using numerical methods which are well known in the art.

The displacement of each of the cutters is calculated based on the previous cutter location, $p_{j,i-1}$, and the current cutter location, $p_{j,i}$, 426. As shown at the top of FIG. 4C, the forces on each cutter are then determined from cutter/formation interaction data based on the cutter lateral movement, penetration depth, interference surface area, contact edge length, and other bit design parameters eg back rake angle, side rake angle, and bevel size of cutter), 428. Cutter wear is also calculated for each cutter based on the threes on each cutter, the interaction parameters, and the wear data for each cutter, 430. The cutter shape is modified using the wear results to form a worn cutter for subsequent calculations, 432.

Once the forces ($F_N$, $F_{cut}$, $F_{side}$) on each of the cutters during the incremental drilling step are determined, 422, these forces are resolved into bit coordinate system, $O_{ZR\theta}$, illustrated in FIG. 8, (axial (Z), radial (R), and circumferential). Then, all a the forces on the cutters in the axial direction are summed to obtain a total axial force $F_Z$ on the bit. The axial force required on the bit during the incremental drilling step is taken as the weight on bit (WOB) required to achieve the given ROP, 424.

Finally, the bottomhole pattern is updated, 434. The bottomhole pattern can be updated by removing, the formation in the path of interference between the bottomhole pattern resulting from the previous incremental drilling step and the path traveled by each of the cutters during the current incremental drilling step.

Output information, such as forces on cutters, weight on bit, and cutter wear, may be provided as output information, at 436. The output information may include any information or data which characterizes aspects of the performance of the selected drill bit drilling the specified earth formations. For example, output information can include forces acting on the individual cutters during drilling, scraping movement/distance of individual cutters on hole bottom and on the hole wall, total forces acting, on the bit during drilling, and the weight on bit to achieve the selected rate of penetration for the selected bit. As shown in FIG. 4C, output information is used to generate a visual display of the results of the drilling simulation, at 438. The visual display 438 can include a graphical representation of the well bore being drilled through earth formations. The visual display 438 can also include a visual depiction of the earth formation being drilled with cut sections of formation calculated as removed from the bottomhole during drilling being visually "removed" on a display screen. The visual representation may also include graphical displays, such as a graphical display of the forces on the individual cutters, on the blades of the bit, and on the drill bit during the simulated drilling. The means used for visually displaying aspects of the drilling, performance is a matter of choice for the system designer, and is not a limitation on the disclosure.

As should be understood by one of ordinary skill in the art, the steps within the main simulation loop 410 are repeated as desired by applying a subsequent incremental rotation to the bit and repeating the calculations in the main simulation loop 410 to obtain an updated cutter geometry (if wear is modeled) and an updated bottomhole geometry for the new incremental drilling step. Repeating the simulation loop 410 as described above will result in the modeling of the performance of the selected fixed cutter drill hit drilling the selected earth formations and continuous updates of the bottomhole pattern drilled. In this way, the method as described can be used to simulate actual drilling of the bit in earth formations.

An ending condition, such as the total depth to be drilled, can be given as a termination command for the simulation, the incremental rotation and displacement of the bit with subsequent calculations in the simulation loop 410 will be repeated until the selected total depth drilled $$\left( \text{e.g., } D = \sum^{i} \Delta d_{bit,i} \right)$$

is reached. Alternatively, the drilling simulation can be stopped at any time using any other suitable termination indicator, such as a selected input from a user.

Figure 9A:
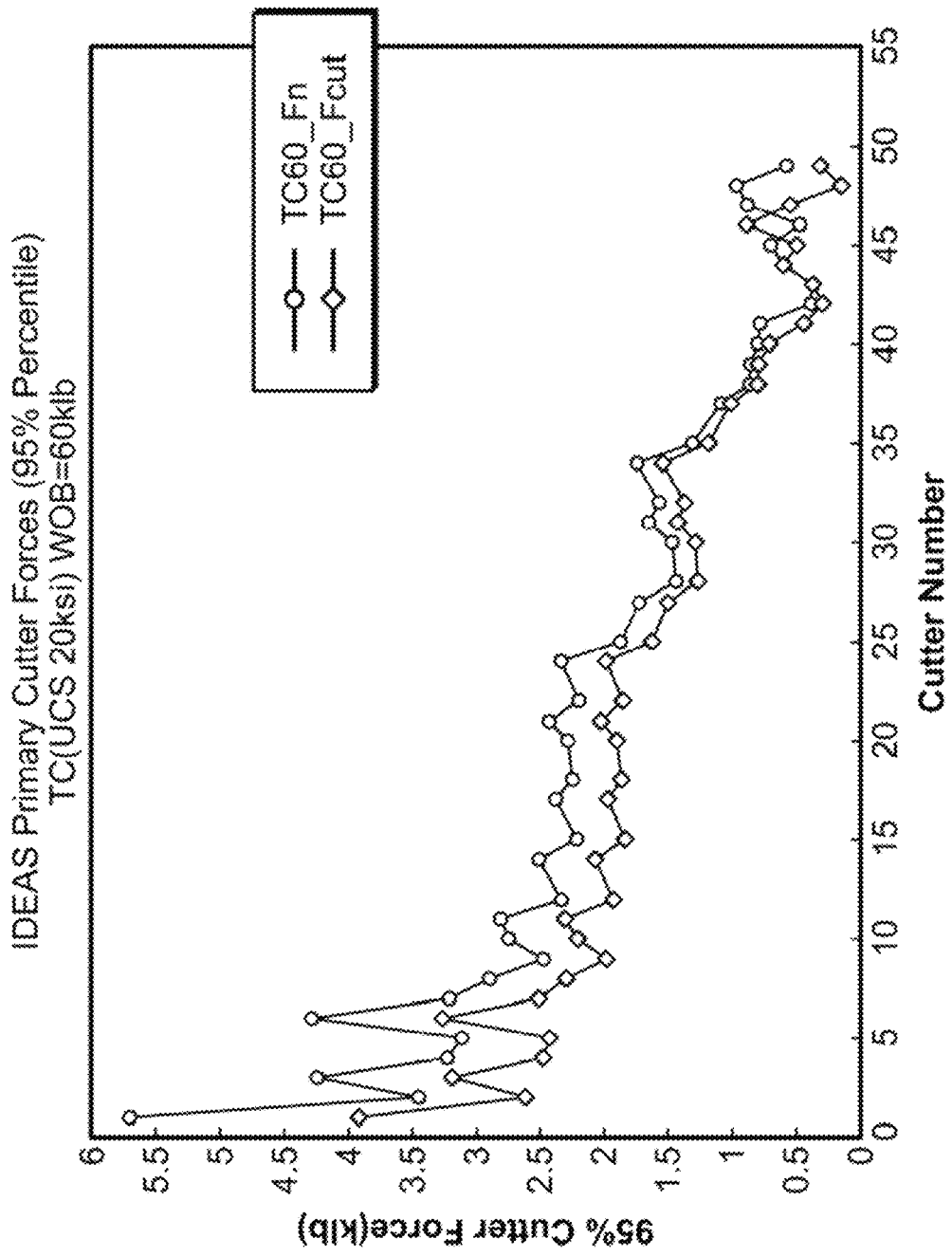
FIG. 9A shows cutter threes for a selected formation.
Figure 9B:
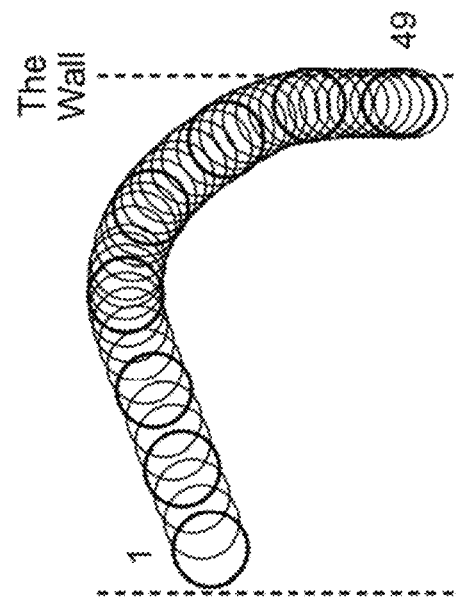
FIG. 9B shows cutter numbering
Figure 9B:
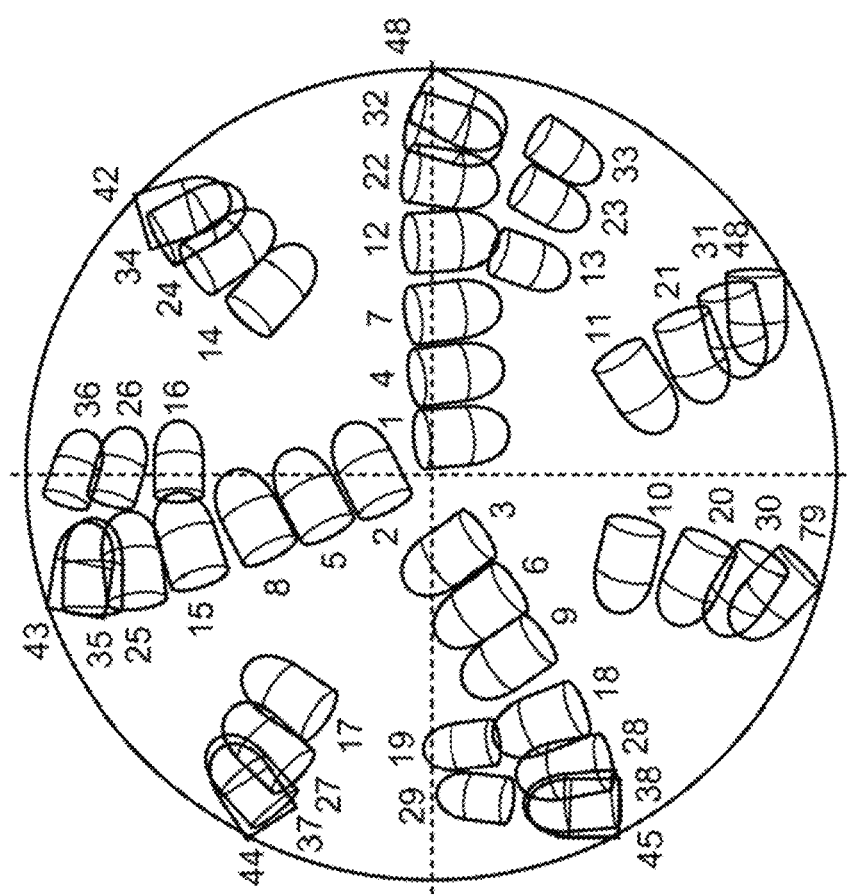
Figure 10A:
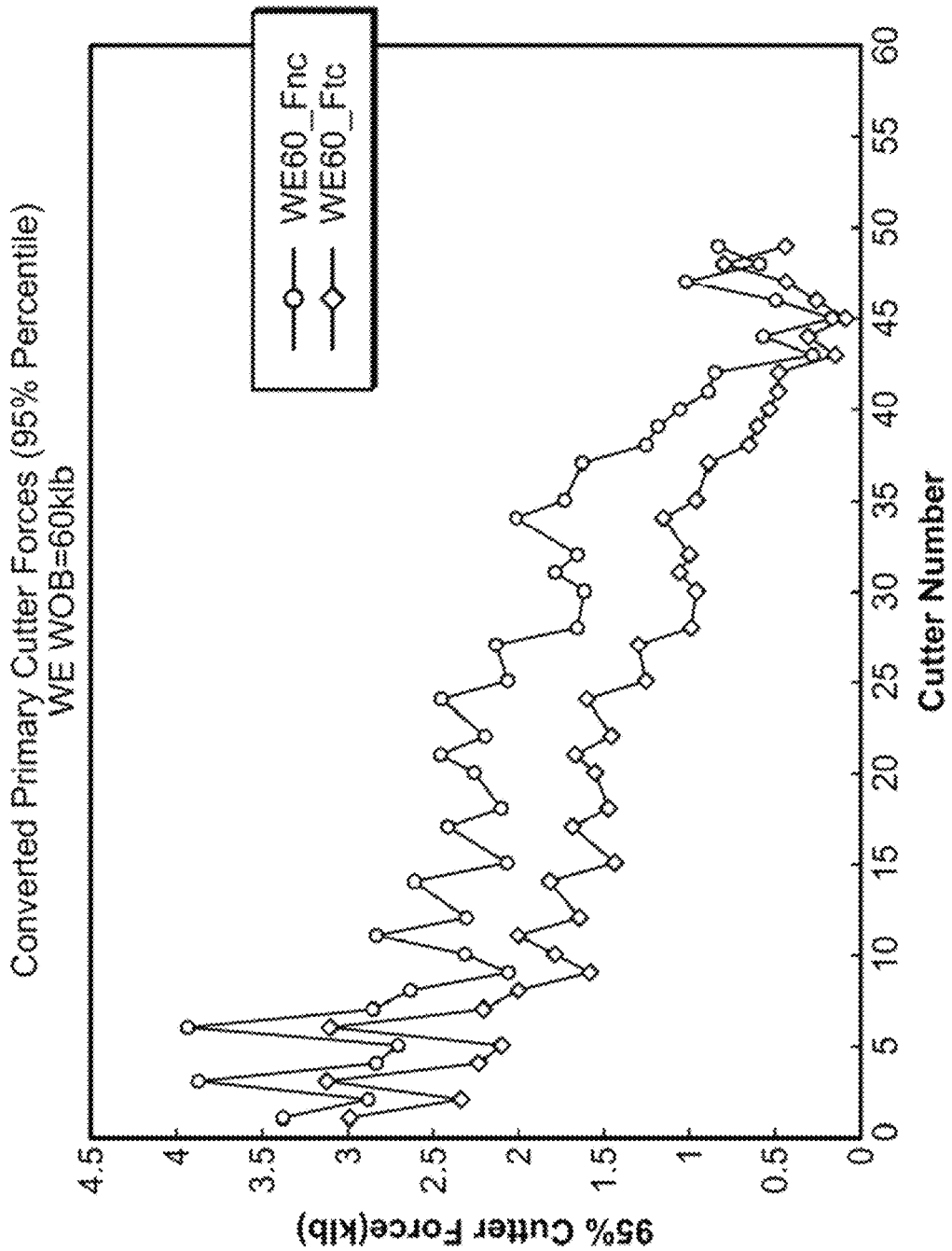
FIG. 10A shows cutter threes for a selected formation.
Figure 10B:
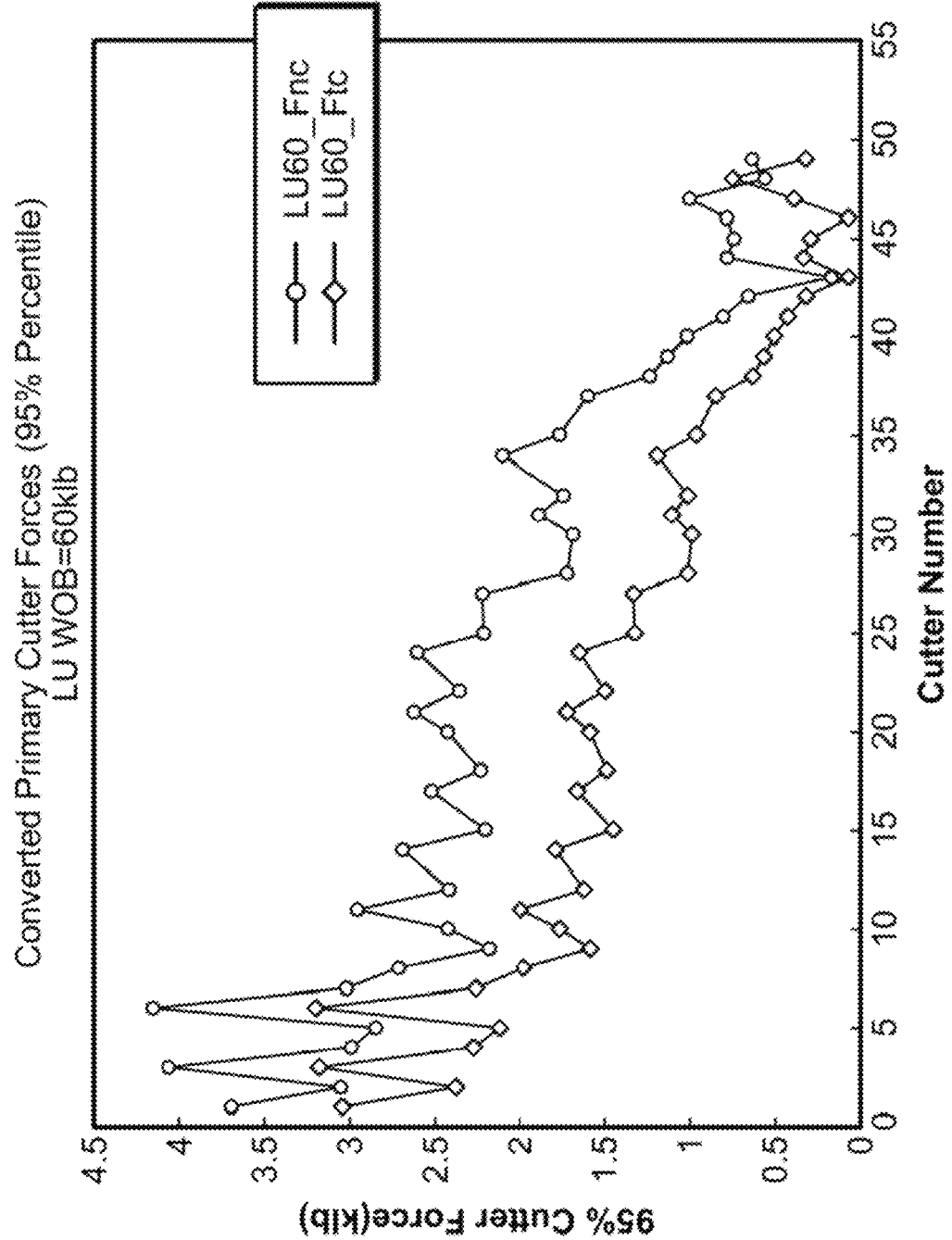
FIG. 10B shows cutter forces for a selected formation.
Figure 10C:
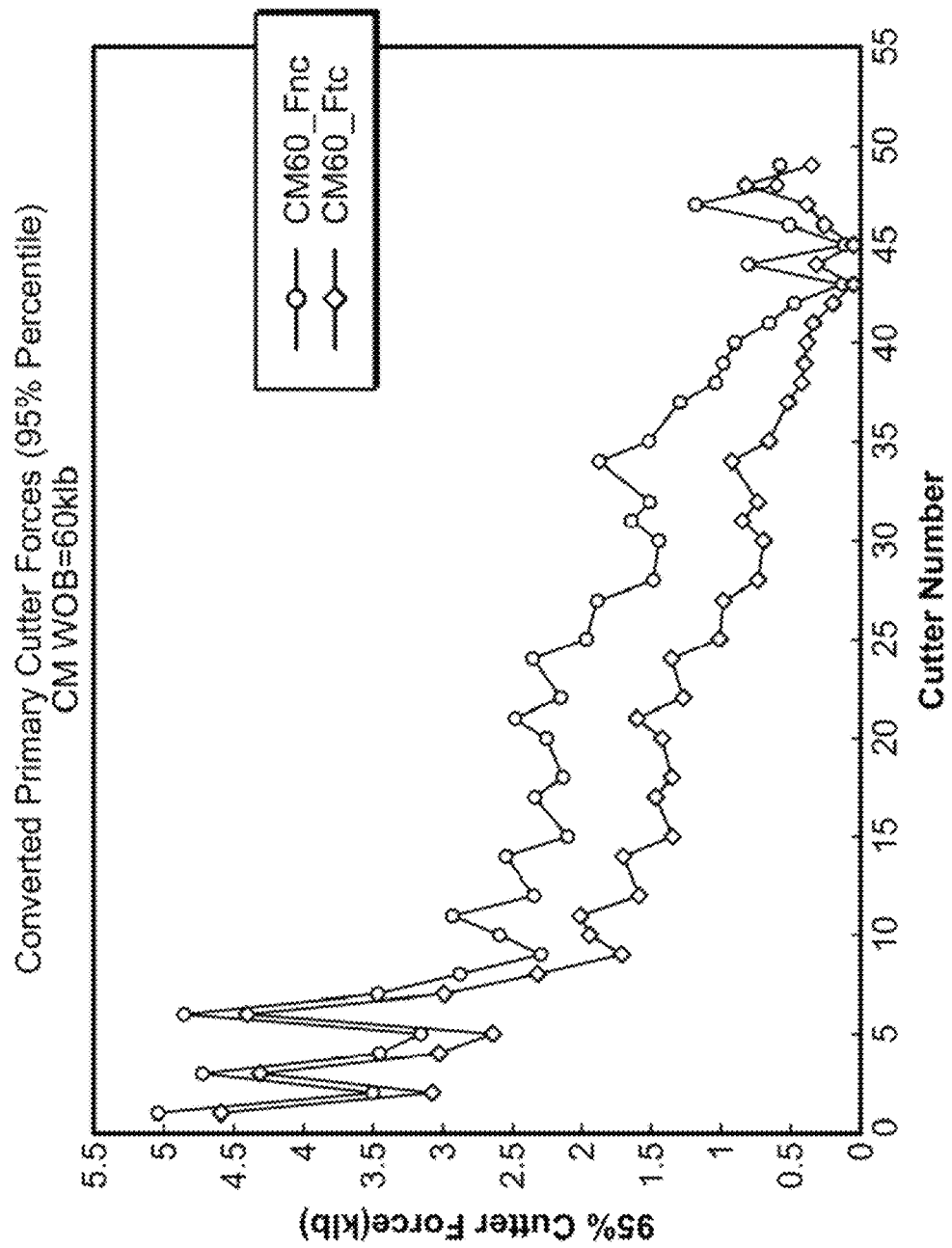
FIG. 10C shows cutter forces thr a selected formation.
Figure 10D:
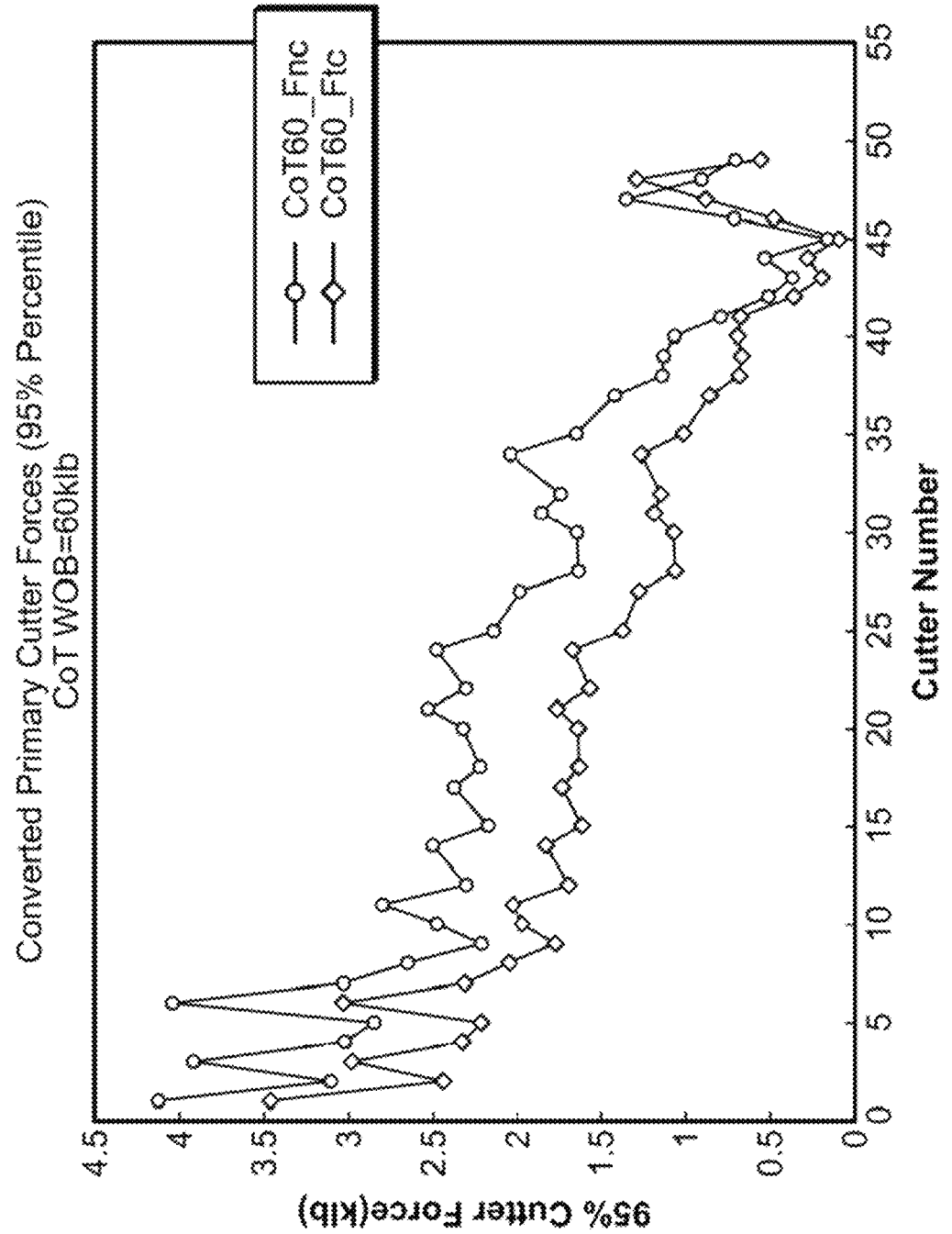
FIG. 10D Shows cutter forces for a selected formation.
Figure 10E:
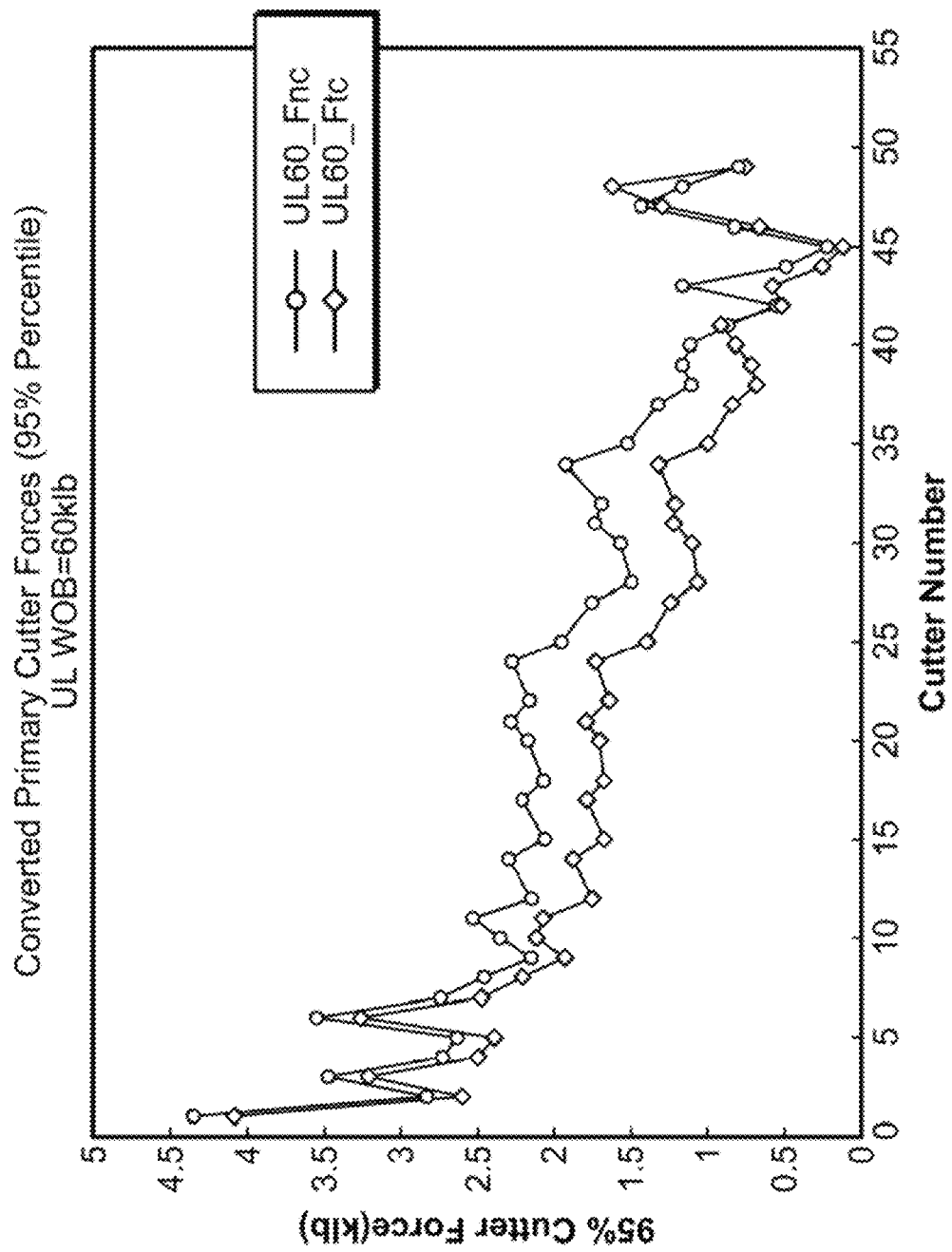
FIG. 10E shows cutter forces for a selected formation.

After the simulation has been completed, the outputs from the simulation, such as forces acting on the cutters ($F_n$, and $F_{cut}$)(as shown in FIG. 5), can be plotted, as shown in FIG. 9A. In FIG. 9A, the X-axis is shown as the cutter number (where cutter number is a numbering system for the cutters when they are rotated into a single plane view, where 1 is the cutter closest to the bit axis, and the numbering increases as one heads radially outward to the edge of the bit). The Y-axis shows the force acting on the hit in klb. FIG. 9B shows how the cutters are numbered.

FIGS. 10A-10E show the effects of formation type on the cutter force, as each plot represents a different formation type. The formation cutter tests referenced above, may be used to calculate the forces acting, on the cutter for a given formation. If an exact formation match does not exist, an approximation of the formation can be made based on known similar formations.

Figure 11:
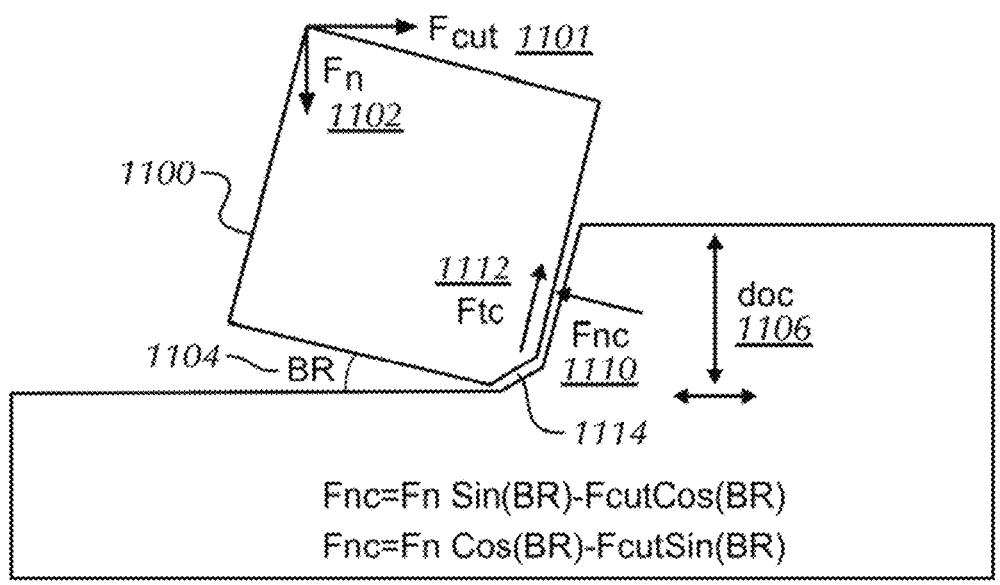
FIG. 11 shows an example of a conversion of cutter forces.

After the forces acting on the cutter have been generated, they can next be resolved as shown in FIG. 11. As shown in FIG. 11, the forces $F_{cut}$ 1101 and $F_n$ 1102 can be resolved into forces $F_{nc}$ 1110 and $F_{tc}$ 1112, for a given back rake angle (BR) 1104. Specifically, $F_{nc}=F_n \sin(BR)+F_{cut} \cos(BR)$, while $F_{tc}=F_n \cos(BR)-F_{cut} \sin(BR)$. As shown in FIG. 11, $F_{tc}$ is a measure of the stress acting behind the bevel 1114 at the cutter tip, while $F_{nc}$ is a measure of the stress acting on the diamond table face at the cutter tip. The depth of cut 1106 helps determine the geometry of the cutter 1100.

Figure 12:
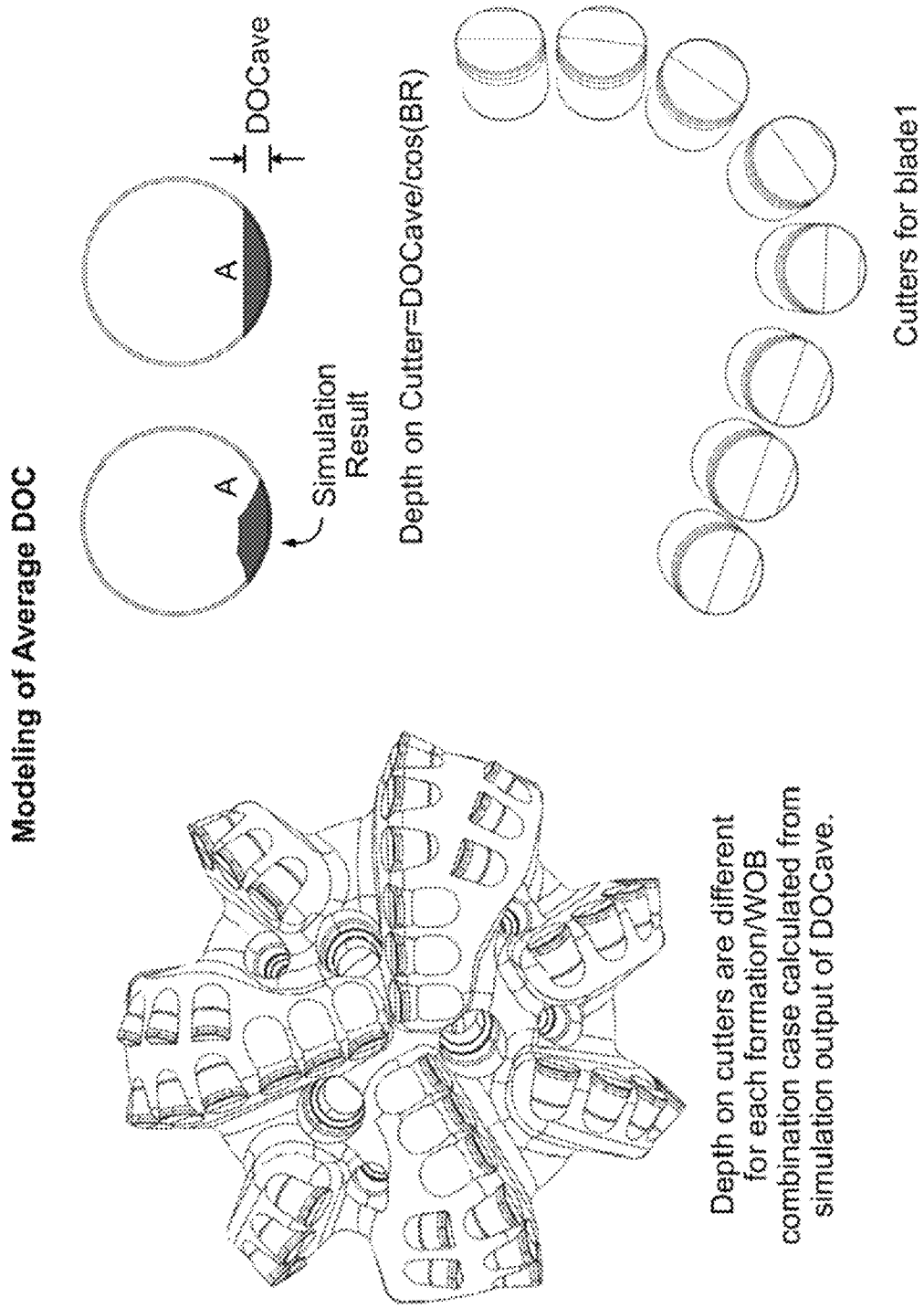
FIG. 12 shows an example of determining and average depth of cut.

After the forces $F_{nc}$ and $F_{tc}$ have been determined, an average depth of cut may be determined for use in analyzing the cutter forces in FEA. As shown in FIG. 12, the simulation predicts an actual depth of cut profile for each cutter. This actual depth of cut profile may be modified to create an average depth of cut. The average depth of cut is then divided by the cosine of the back rake angle to create an overall depth on cutter (i.e., the depth that the cutter interacts with the formation).

Figure 13:
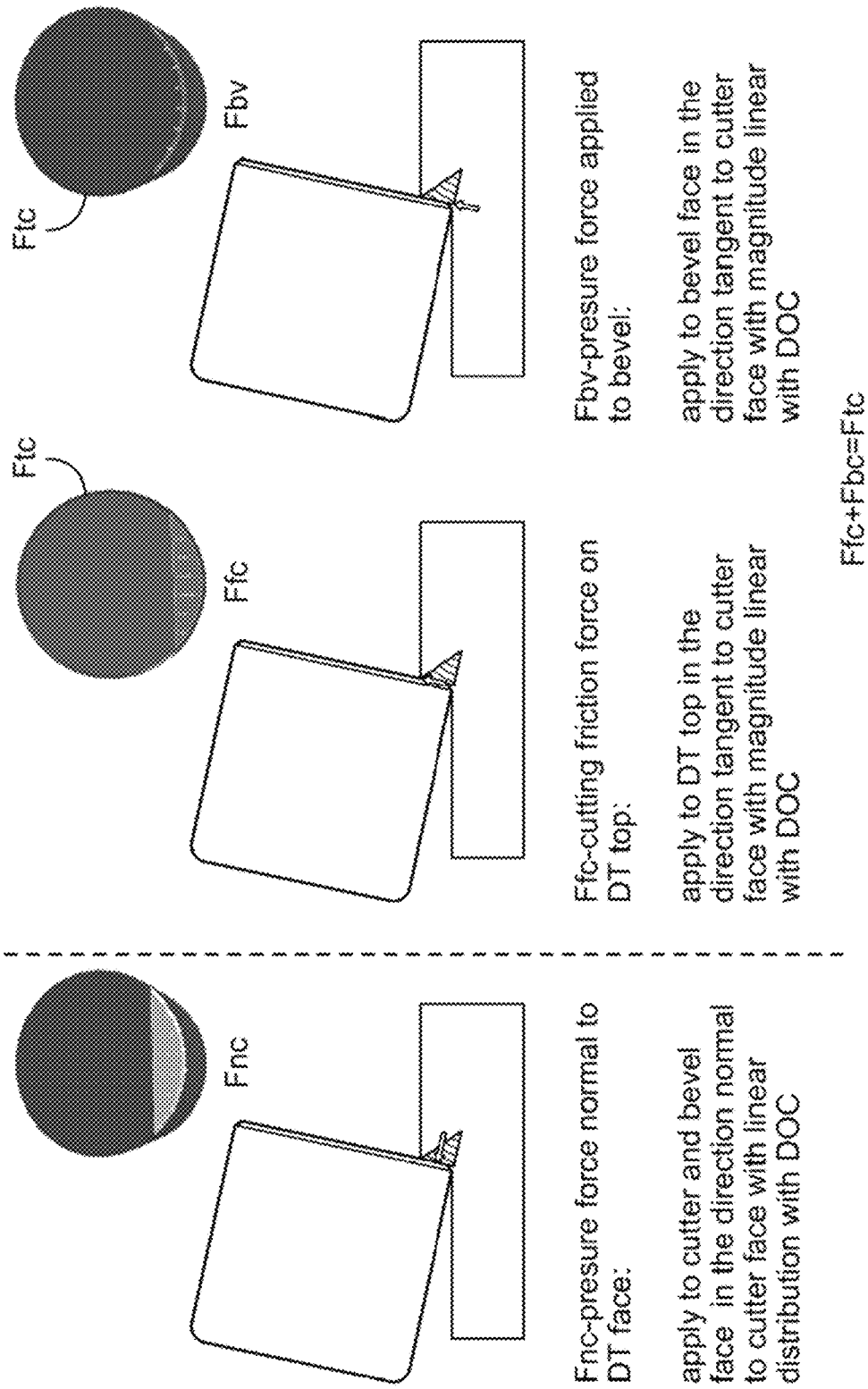
FIG. 13 shows an example of a cutter force loading method.

Prior to loading into FEA, the forces are further resolved as shown in FIG. 13. Specifically, $F_{tc}$ is resolved into two sub forces, $F_{fc}$ and $F_{bv}$, where $F_{tc}=F_{fc}+F_{bv}$. $F_{fc}$ is the cutting frictional force on the diamond table, and is applied to the diamond table in the direction tangential to the cutter face having a magnitude linear with the depth on cutter (calculated above). $F_{bv}$ is the force applied to the bevel, and is applied to the bevel face in the direction tangential to the cutter face. Again, $F_{nc}$, is the force applied to the cutter and the bevel face in the direction normal to the cutter face.

After resolving the forces above, the inputs for the FEA program are set. First, material properties, stress limits, and other conditions known to those of ordinary skill in the art are put into the FEA program. In one embodiment, the below material properties were used to define the cutter.

| Material | E (ksi) | v | $\sigma_u$ (ksi) |
|---|---|---|---|
| PDC Cutter DT | 120,000 | 0.2 | 188 |
| PDC Cutter Substrate | 100,000 | 0.2 | 250 |

Figure 14:
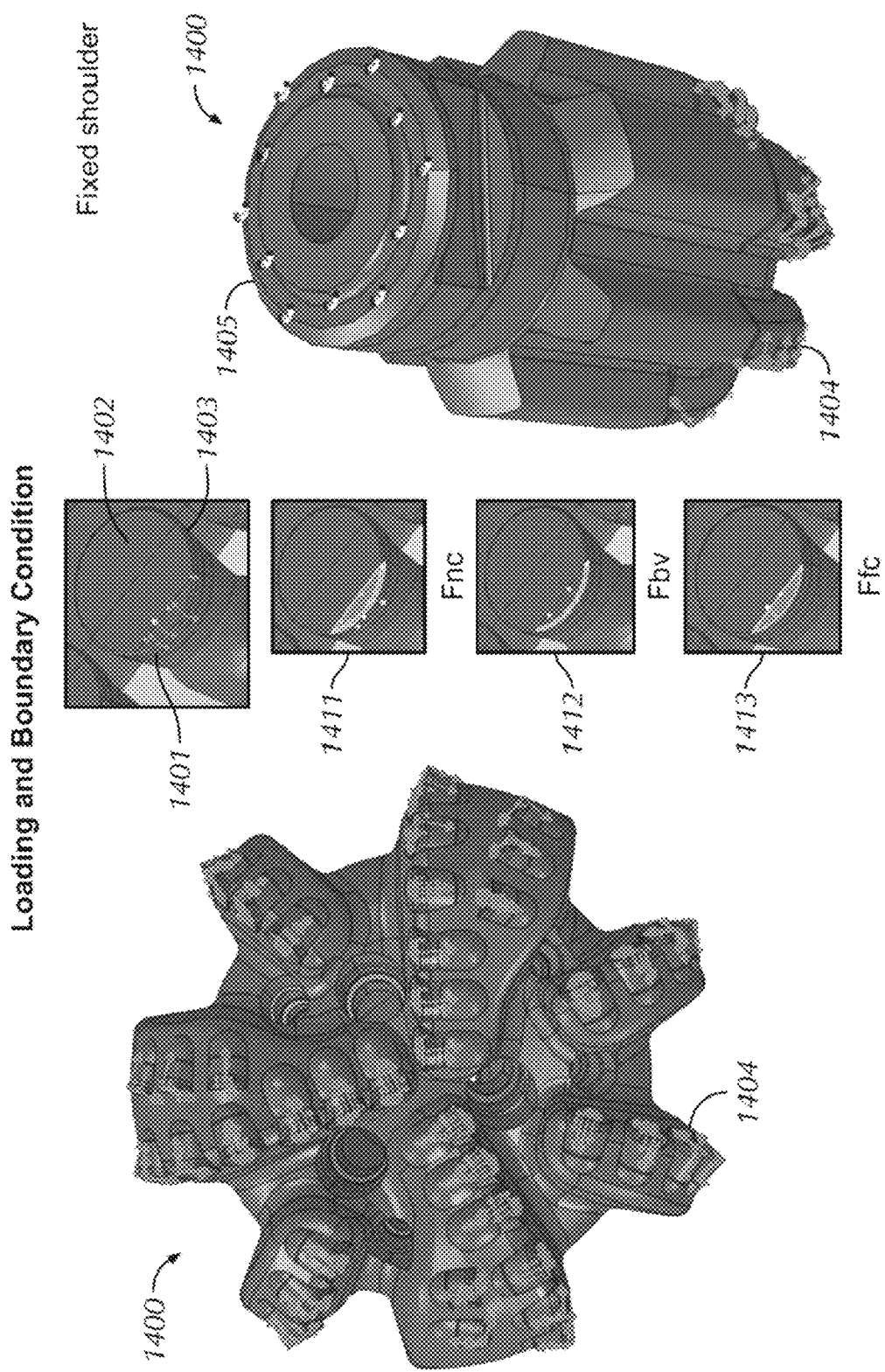
FIG. 14 shows an example of subcomponent forces acting on a cutter.

Next, the loading and boundary conditions are set for the FEA program. FIG. 14 shows the details how the component forces are applied to each cutter tip area for all cutters 1402. $F_{nc}$ shown at 1411, where the force is normal to the cutter face. $F_{bv}$, the three on the bevel tangential to the face of the cutter is shown at 1412. $F_{fc}$, the frictional cutting force tangential to the face of the cutter is shown at 1413, 1404 shows the various force components acting on all of the cutters 1402 on the bit 1400. Each individual cutter 1402 is attached to cutter pockets 1403 with tie constrained. The whole bit 1400 is fixed at API pin shoulder 1405 as the boundary condition.

In one embodiment, all forces $F_{nc}$ and $F_{tc}$ ($F_{fc}+F_{bv}$) on all cutters are used as loading inputs for FEA. These forces produce stresses in all components of the whole bit, including the cutter tips. By converting $F_n$ and $F_{cut}$ into $F_{nc}$ and $F_{tc}$ and applying them in a linear distribution, it is possible to determine the true stress distribution in cutter tip area.

Figure 15:
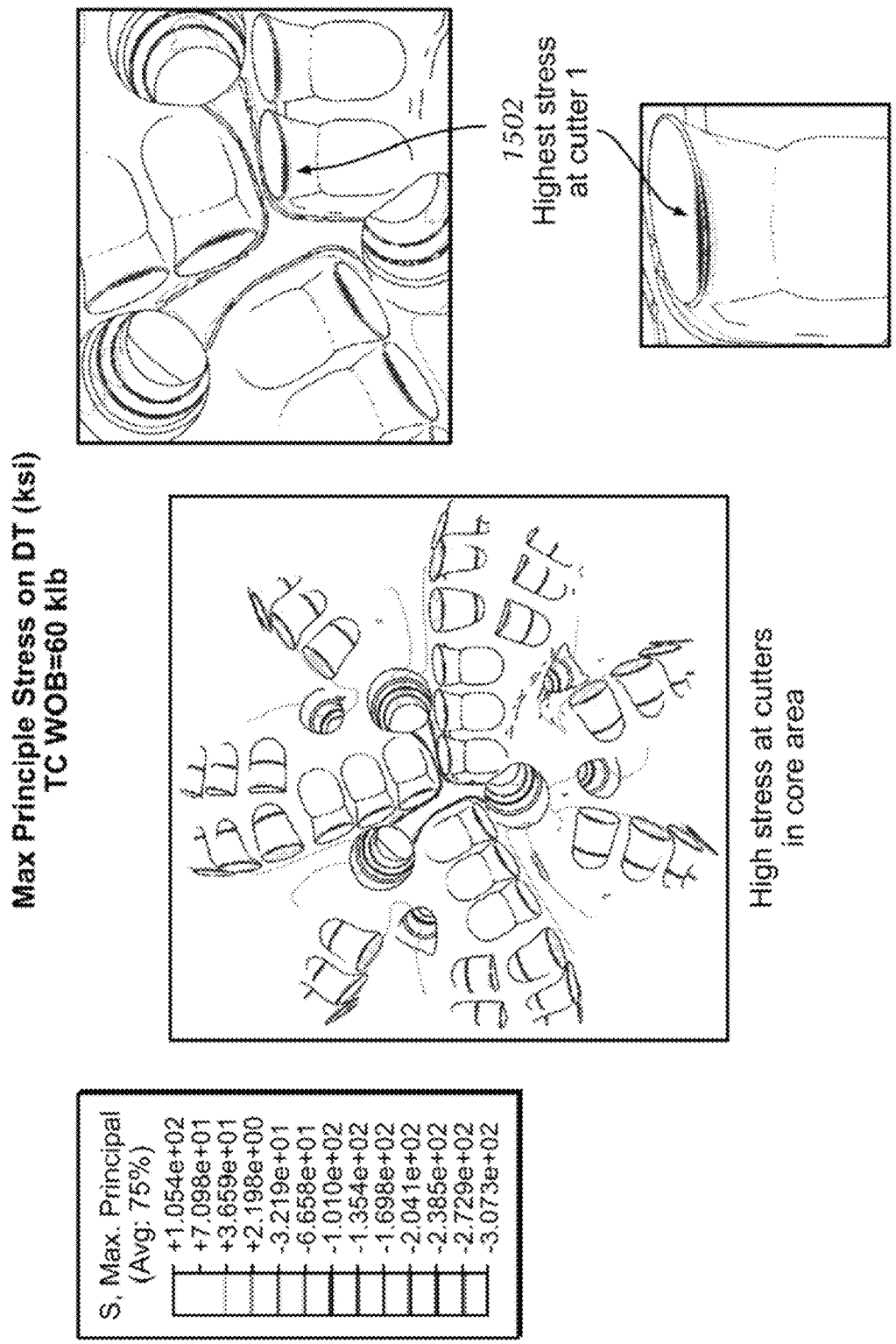
FIG. 15 shows an example of maximum principle stress on a diamond table.
Figure 16:
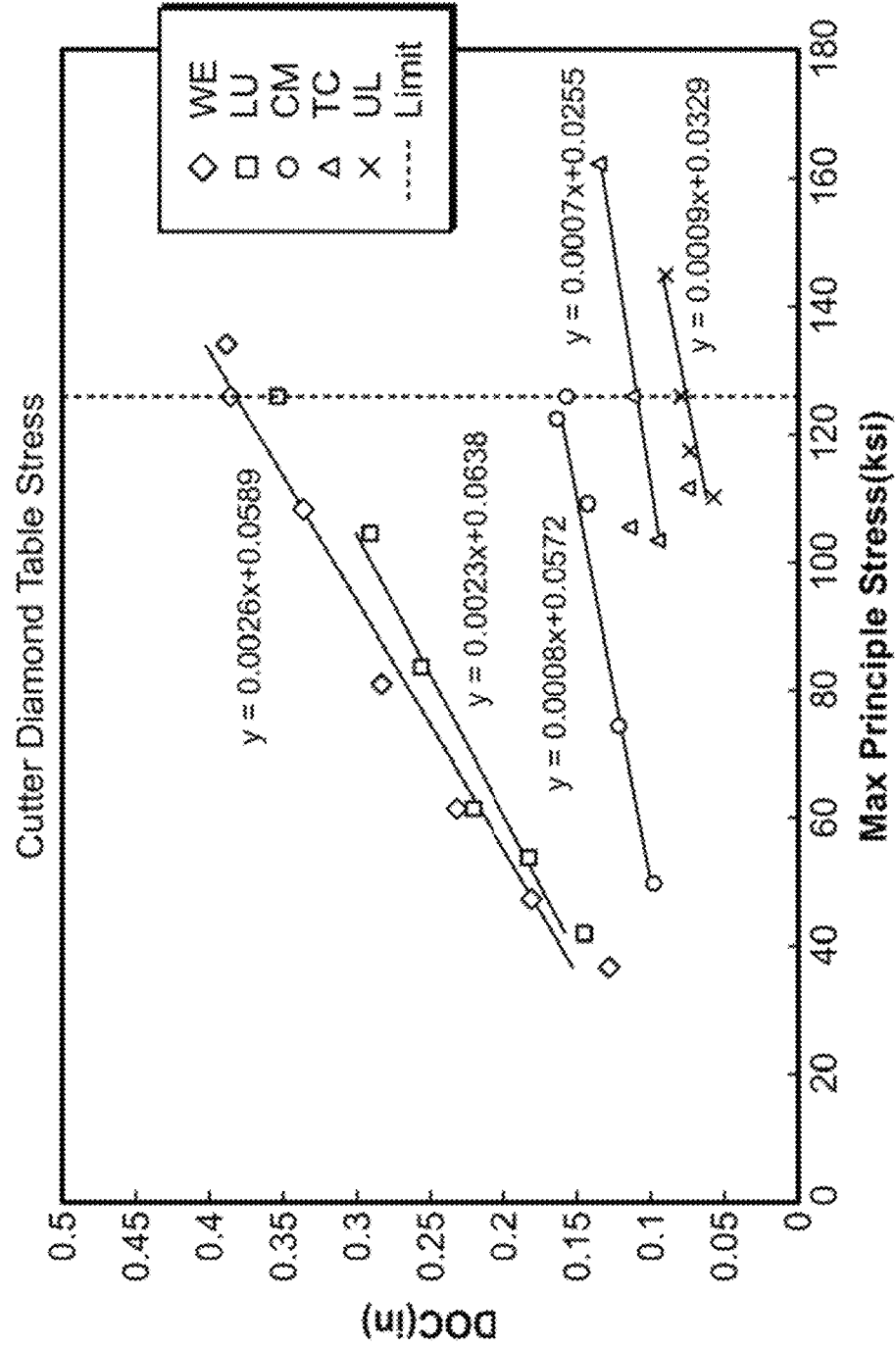
FIG. 16 is a plot of diamond table stresses for various formation types.

Next, the FEA is performed. A number of outputs are possible, as is known to those of ordinary skill in the art. Here, however, to investigate the stress on the diamond table, the maximum principal stress on the diamond table for each cutter is shown. FIG. 15 illustrates the stress seen at the diamond table on each cutter. In FIG. 15, an average depth of cut, as explained above, is assumed, simplifying the results. For this situation, high stress is found at cutter 1, shown at 1502. In general, FEA shows that the highest stresses occur at the cutters adjacent to the center core area. Thus, failure of cutter 1 is predicted to occur before other cutters, The effect of formation, weight on bit, and depth of cut can be investigated to determine the may principle stress shown, and is depicted in FIG. 16. In FIG. 16, the weight on hit and depth of cut are varied, and the effect on max stress for different formations is shown. For each weight on bit, the simulation software predicts a depth of cut, and that information is used to create an average depth of cut, as described above. In general, harder formations result in a lower average depth of cut for a given weight on hit, and produces a higher stress at a lower depth of cut than in a softer formation.

Figure 17:
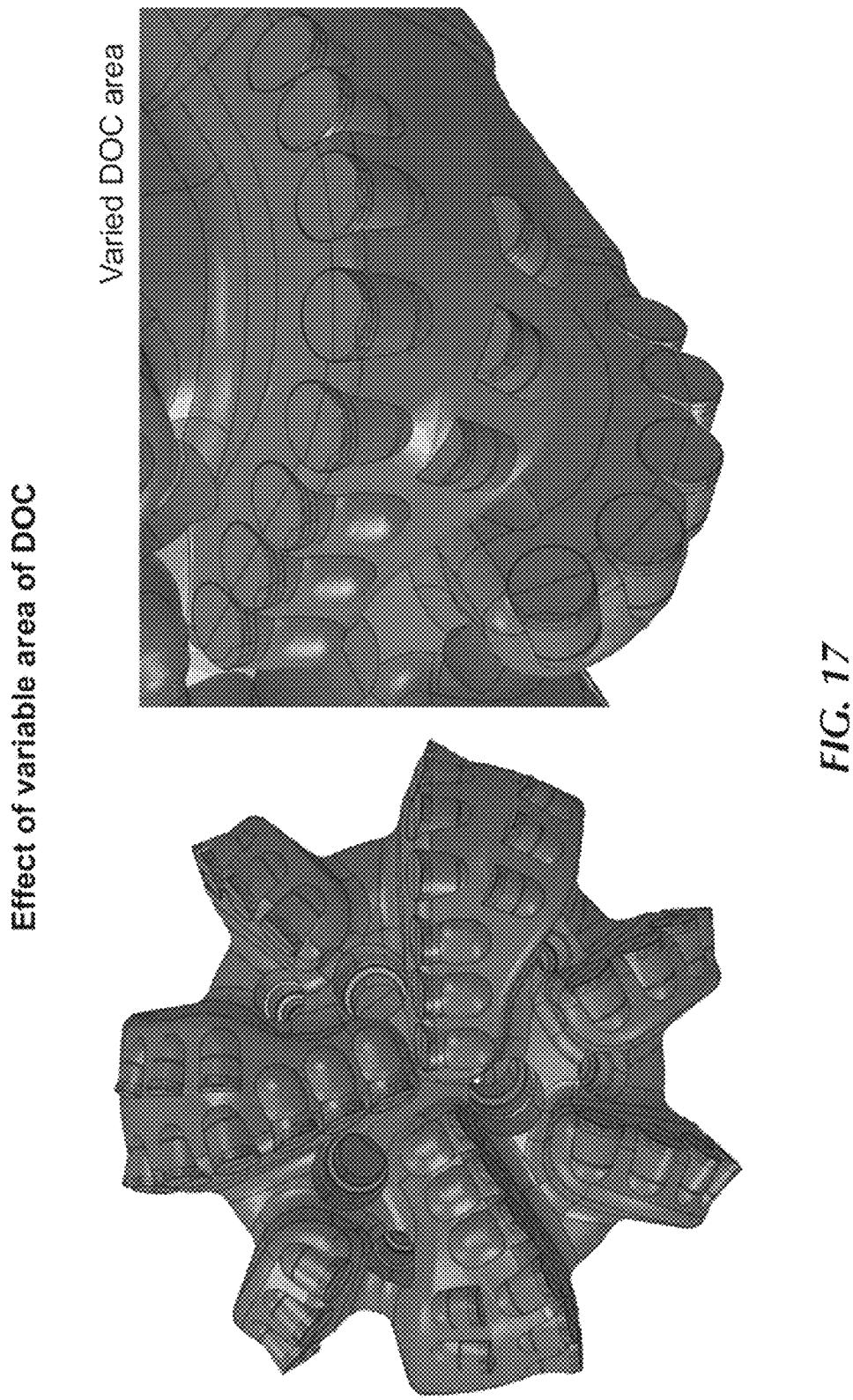
FIG. 17 shows a bit having a variable depth of cut area.
Figure 18:
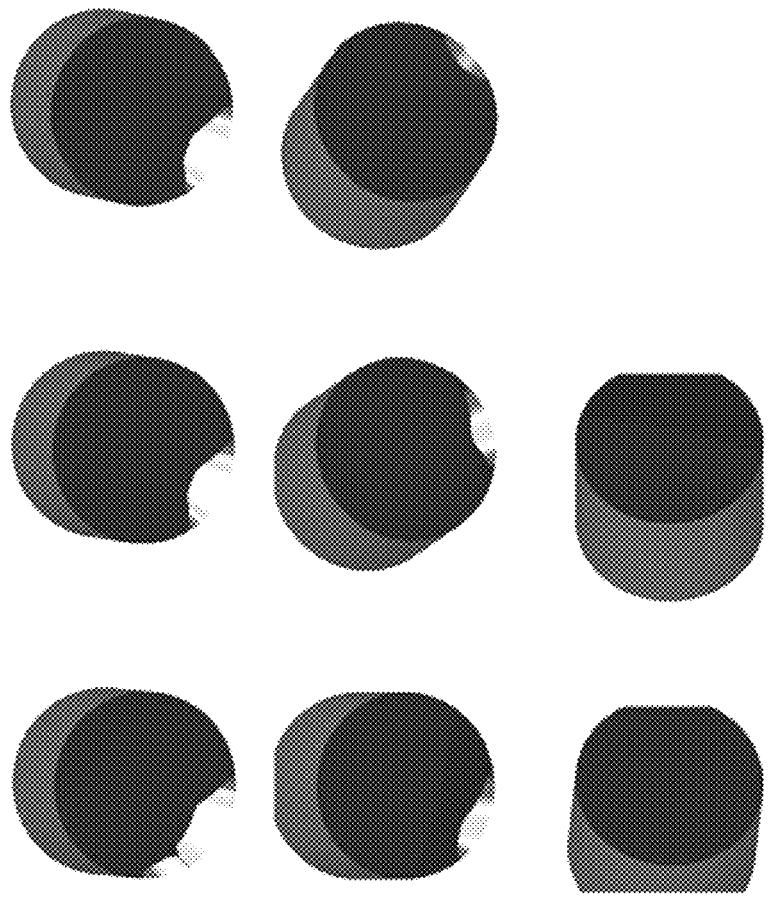
FIG. 18 shows an example of a cutter volume removal map.
Figure 19:
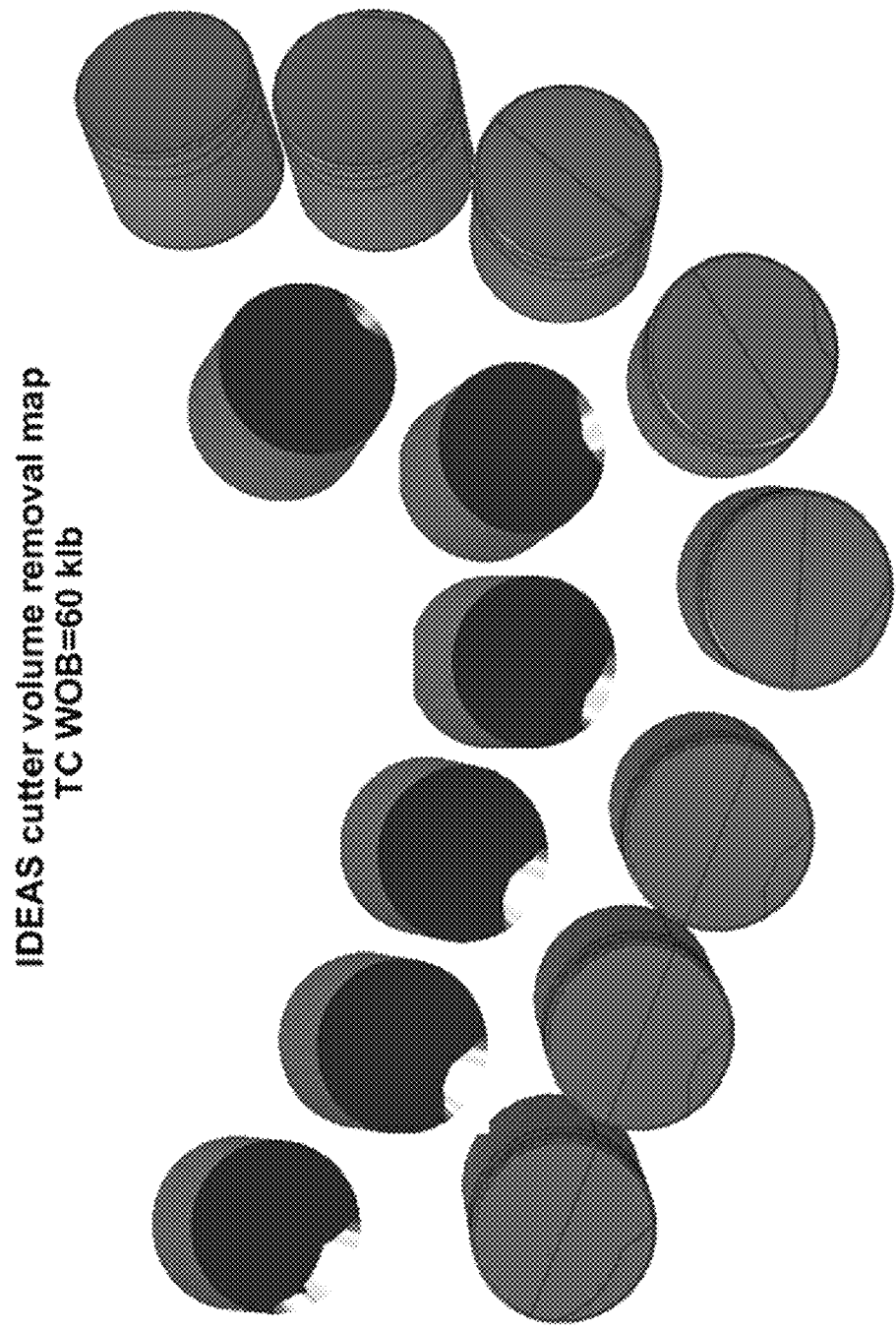
FIG. 19 shows an example of a cutter volume removal map.
Figure 20:
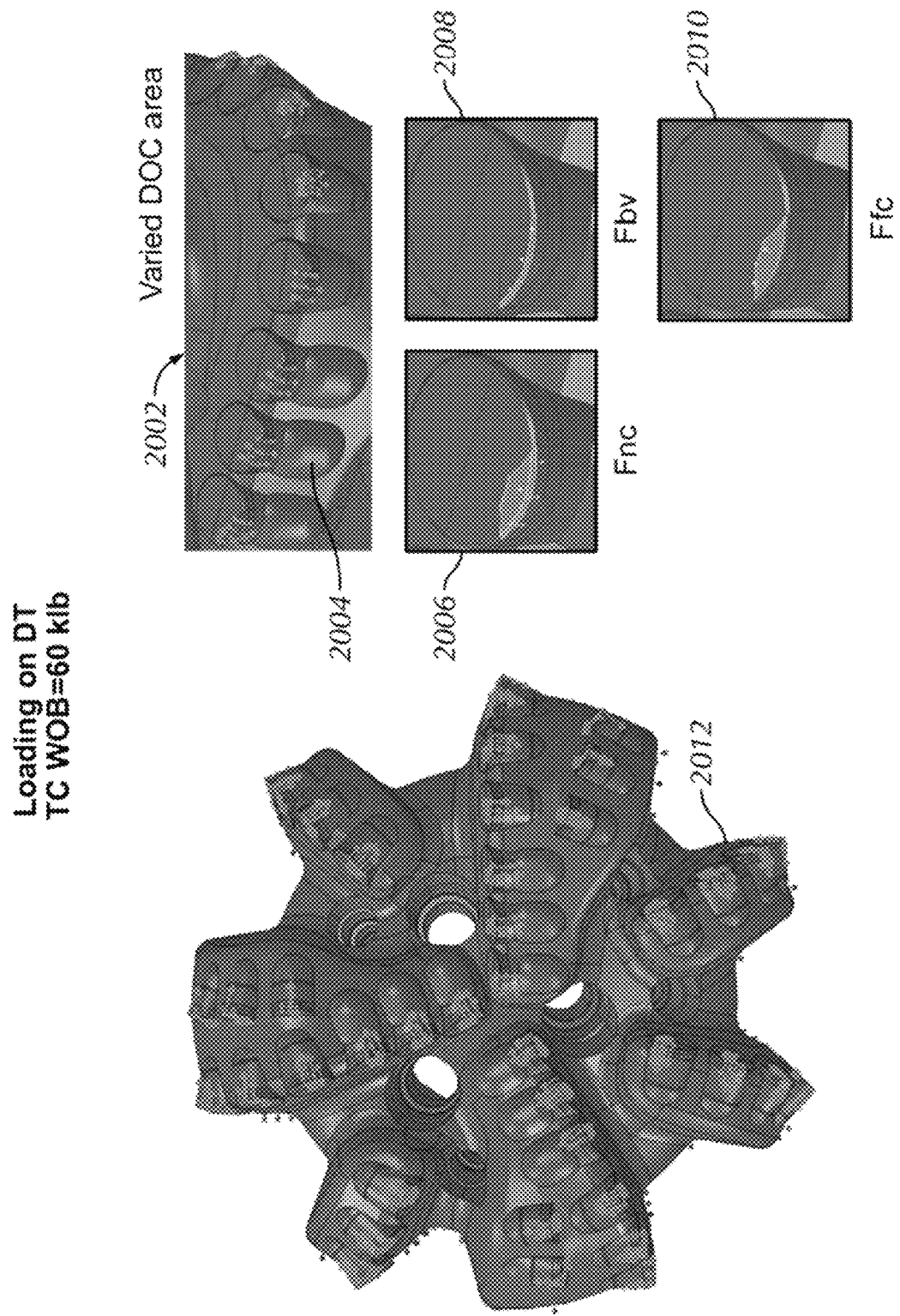
FIG. 20 shows an example of stresses on a diamond table.

In order to produce a more accurate analysis, the information from the software that, shows a variable depth of cut may be used in the FEA program. FIG. 17 shows the predicted depth of cut from the software, for each cutter. As seen in FIG. 17, different cutters have different depths of cut, as a result of their placement on the bit. FIG. 18 shows a cutter volume removal map for a given formation and weight on bit combination. The cutter volume removal map shows how the various cutters engage the formation differently, and, thus, have a different depth of cut. FIG. 19 illustrates the placement on a blade of the cutters. Because the cutters have a different predicted depth of cut, the loading on the diamond table of each cutter will be different, as shown in FIG. 20 where the cutters on a single blade are shown at 2002. As can be seen, the depth of cut for each cutter is different. The various force subcomponents are shown at 2006, 2008, and 2010, for cutter 2004, 2012 illustrates the force subcomponents on the bit as a whole.

Figure 21:
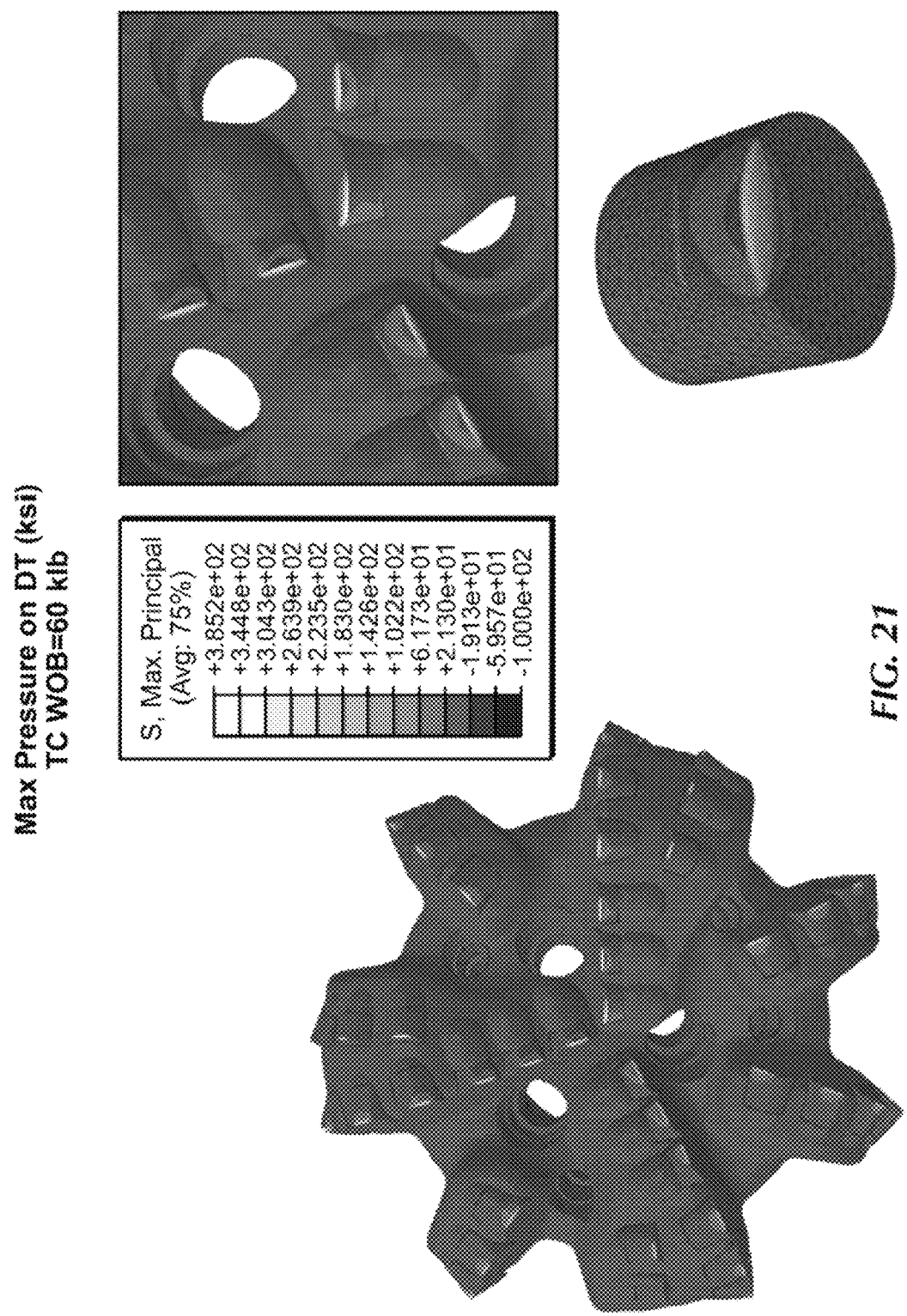
FIG. 21 shows an example of maximum pressure on a diamond table.
Figure 22:
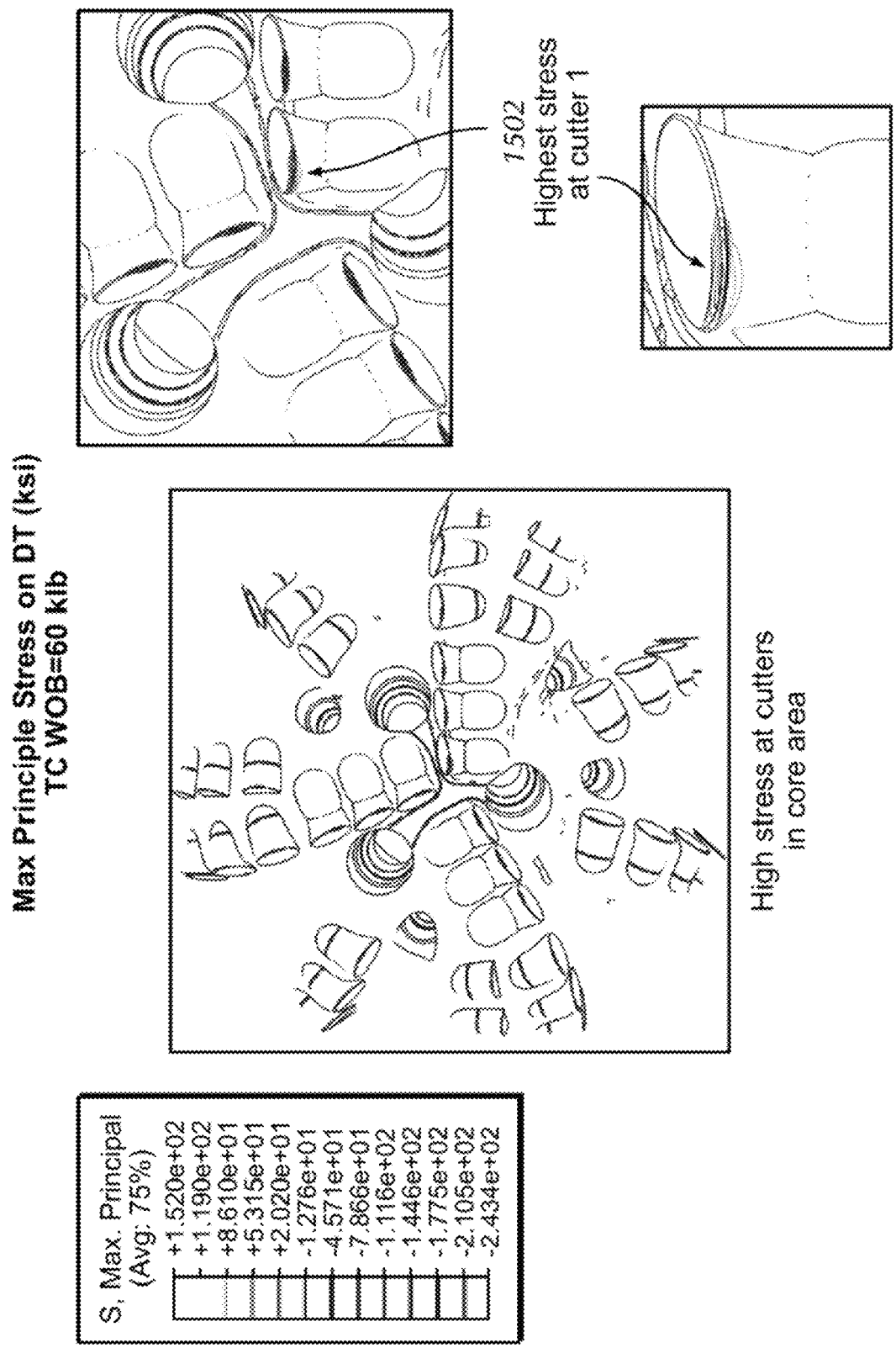
FIG. 22 shows an example of maximum principle stress on a diamond table.
Figure 23:
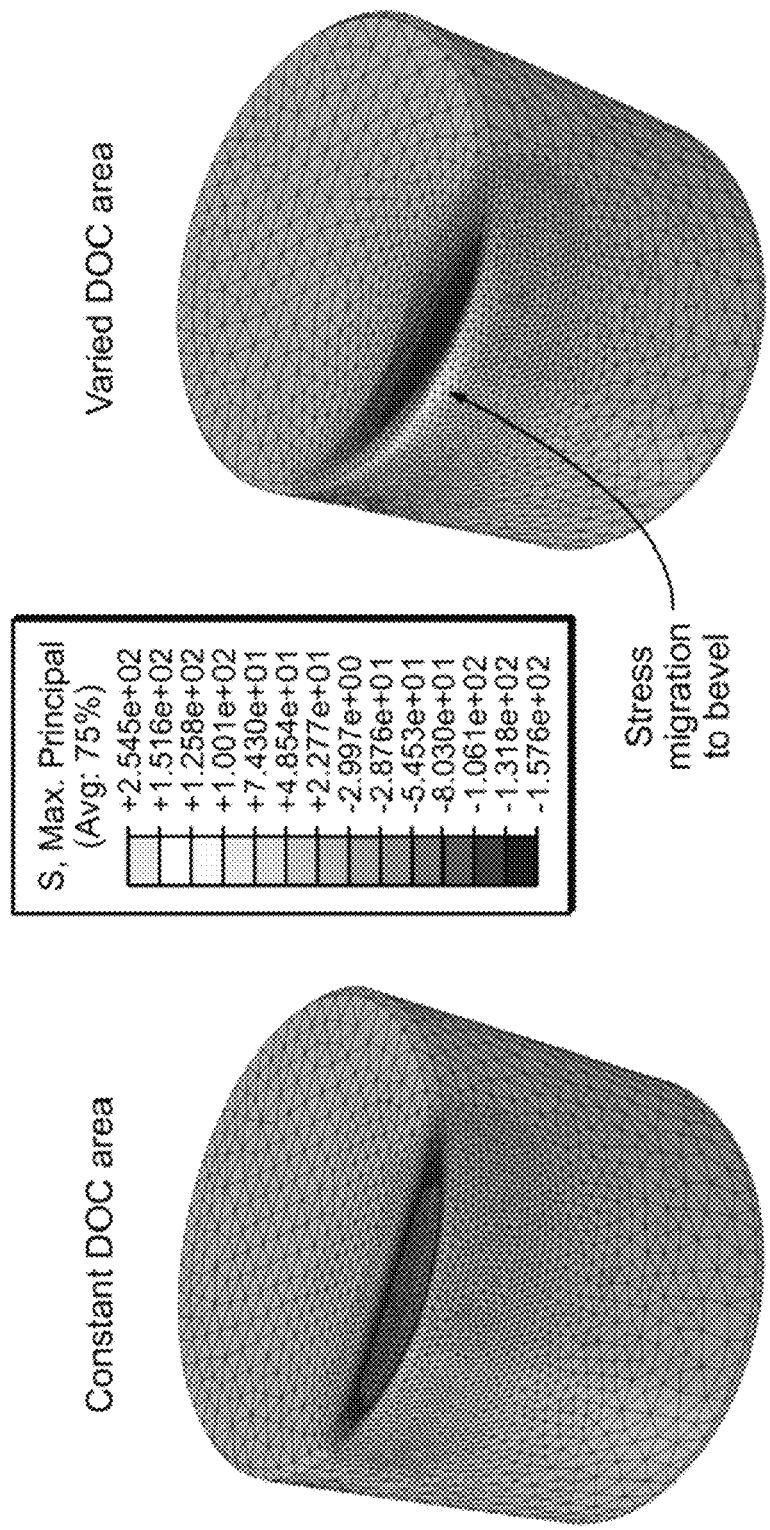
FIG. 23 shows an example of maximum principle stress on a given cutter.
Figure 24:
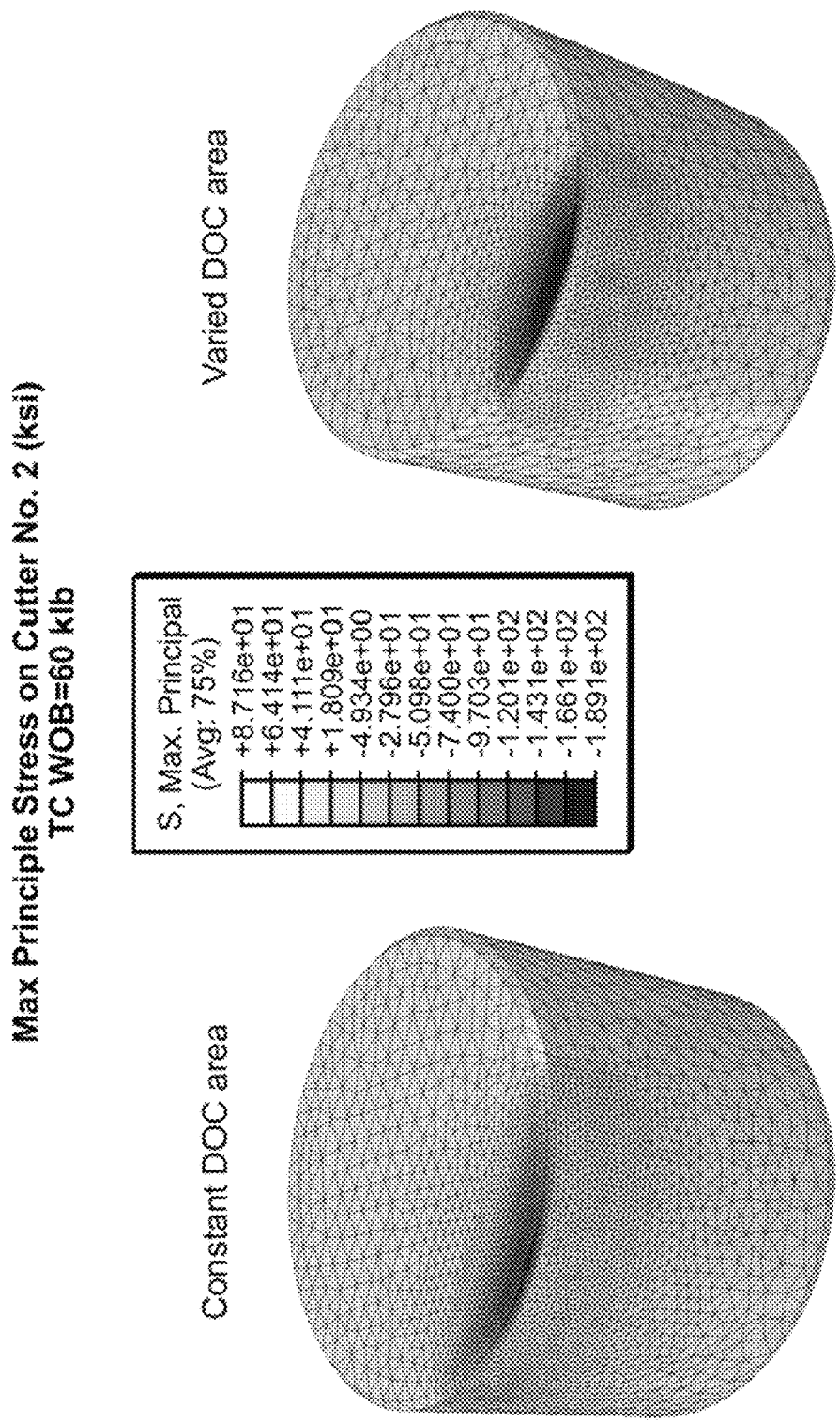
FIG. 24 shows an example of maximum principle stress on a given cutter.
Figure 25:
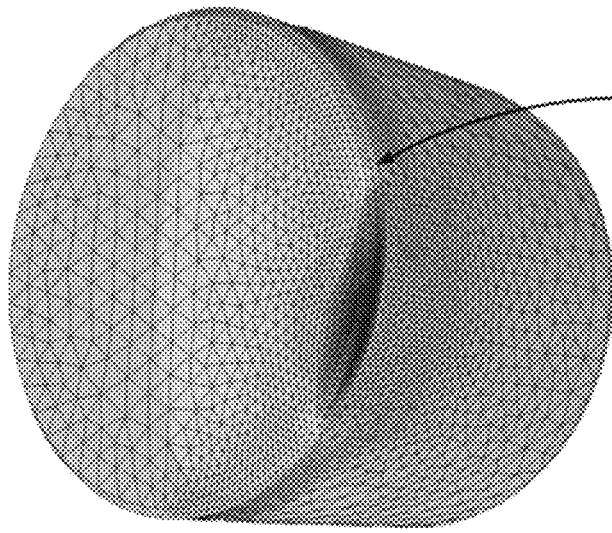
FIG. 25 shows an example of maximum principle stress on a given cutter.
Figure 25:
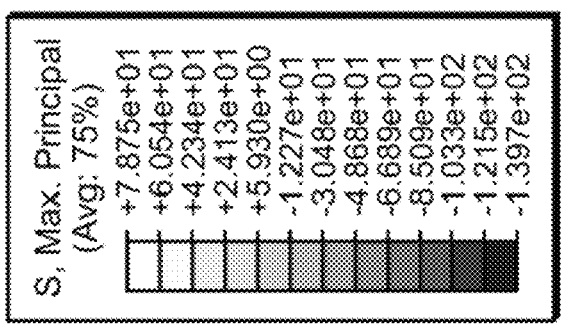
Figure 25:
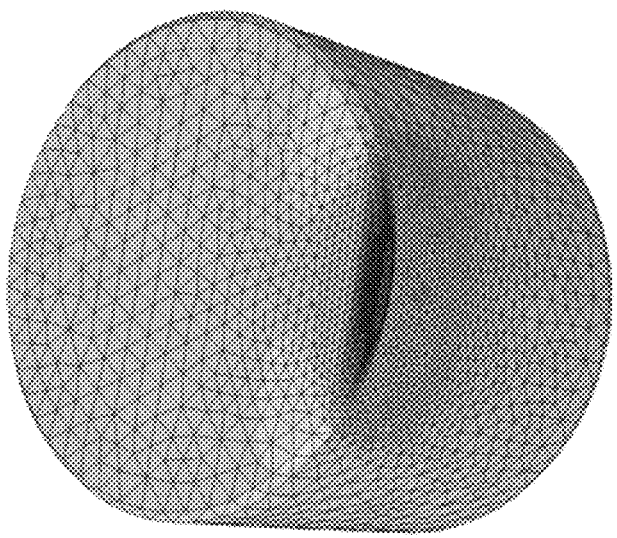

FIG. 21 illustrates the maximum pressure on the diamond table as calculated by FEA. FIG. 22 illustrates the maximum principle stress on the diamond table. Again, high stress is seen at cutter 1, and in the cutters adjacent to the central core. FIG. 23 illustrates the difference between using an average depth of cut and a predicted (actual) depth of cut. As shown in FIG. 23, the results of the two are quite different. The effect of changing between a constant depth of cut and a varied depth of cut is shown for cutter 2 and cutter 25 in FIGS. 24 and 25, respectively. At cutter 25, in particular, it is clear as the depth of cut changes (and is reduced as compared to the average depth of cut), the maximum principle stress migrates to the side of the cutter, as opposed to remaining centered on the diamond table face.

Figure 26:
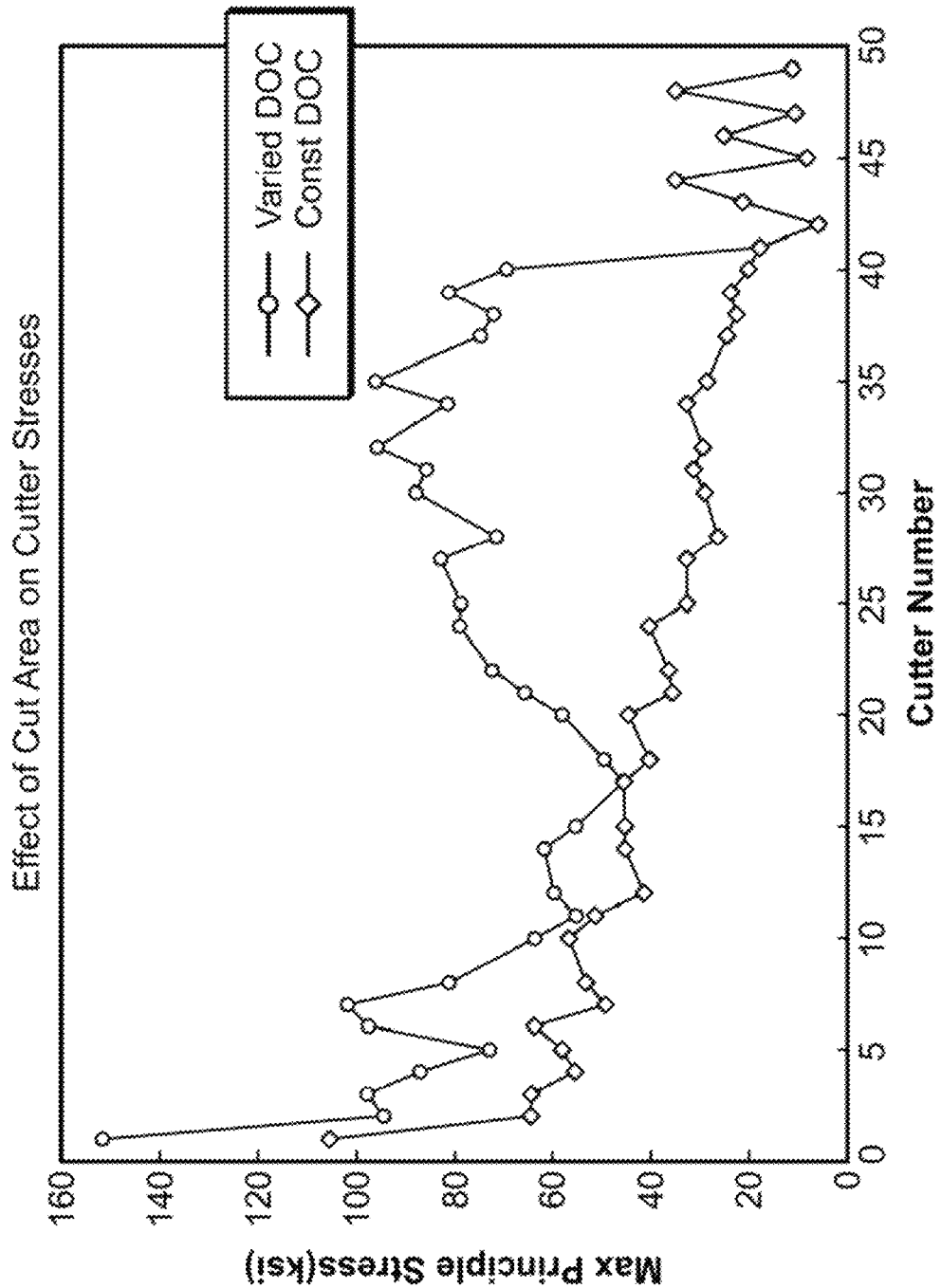
FIG. 26 shows an example plot of the cutting area on cutter stresses.
Figure 27:
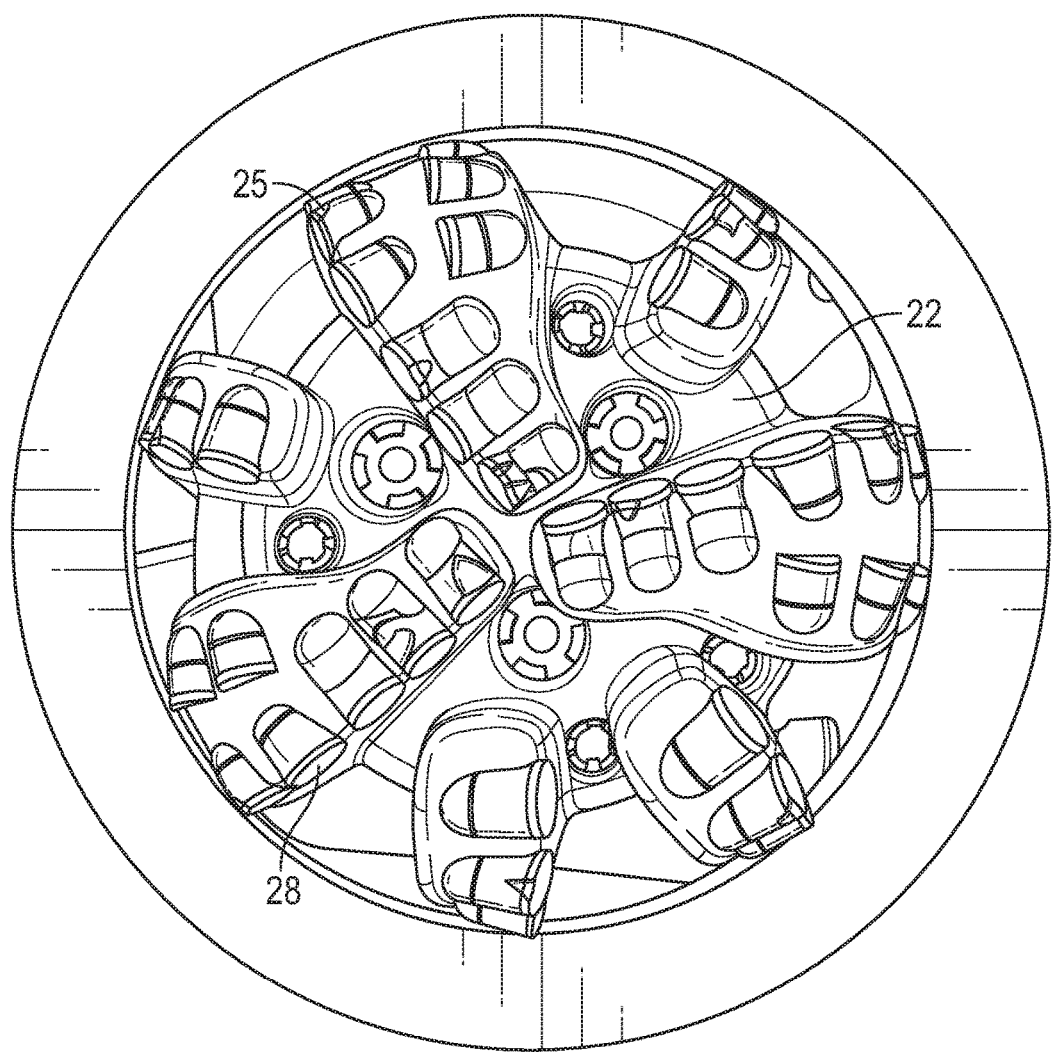
FIG. 27 is a line drawing representation of a photograph of a dull drill bit.
Figure 28:
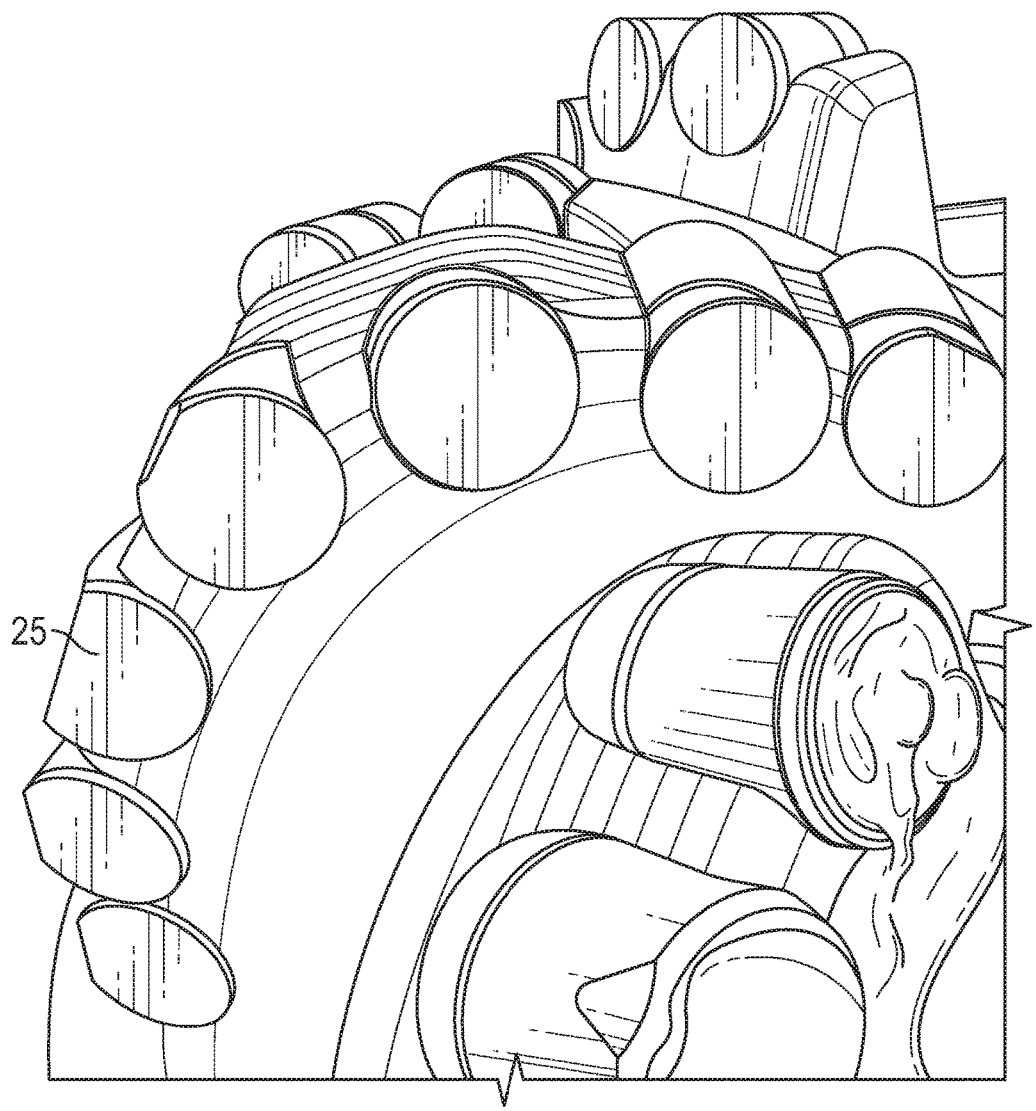
FIG. 28 is a line drawing representation of a photograph of a dull drill bit.

FIG. 26 illustrates the effect of varying the depth of cut (i.e., a non-uniform depth of cut). As shown in FIG. 26, when an average (or constant/uniform across on each cutter) depth of cut is used, the predicted stress is highest at cutter 1 and generally linearly decreases heading to the outside of the bit. However, when the predicted (or variable) depth of cut is used, a large spike in stress is seen beginning around cutter 20 and continues until cutter 40 is reached. Thus, FEA predicts that those cutters will see large stresses and may fail, while the constant depth of cut would predict that they would see relatively low stress. As seen in FIGS. 27 and 28, which are line drawings generated from photographs of actual dull bits run with the weight on bit and in the formation shown in FIG. 26, large wear patterns are seen on cutter 25, which is located on the shoulder of the bit, for example. Thus, the predicted stress comports with what is actually observed, when using the predicted depth of cut.

Returning to FIGS. 23 and 25, the failure mode of the cutters can be predicted, based on the stress migration pattern. In FIG. 23, stress migrates to the bevel area, while in FIG. 25, stress migrates to the top right of the cutter surface. Cutter 25, therefore, has a higher tendency to snap out (as a crack will start at the cutter top). Advantageously, therefore, embodiments disclosed herein allow for the prediction of how a given cutter is likely to fail. Previously, this predictive ability did not exist. As a result, remedial measures, such as altering the shape, placement, or number of cutters, for example, can be performed when initially designing the bit to shift the stress pattern to a more desirable one. Those of ordinary skill in the art will recognize that other remedial measures may be employed.

Figure 29:
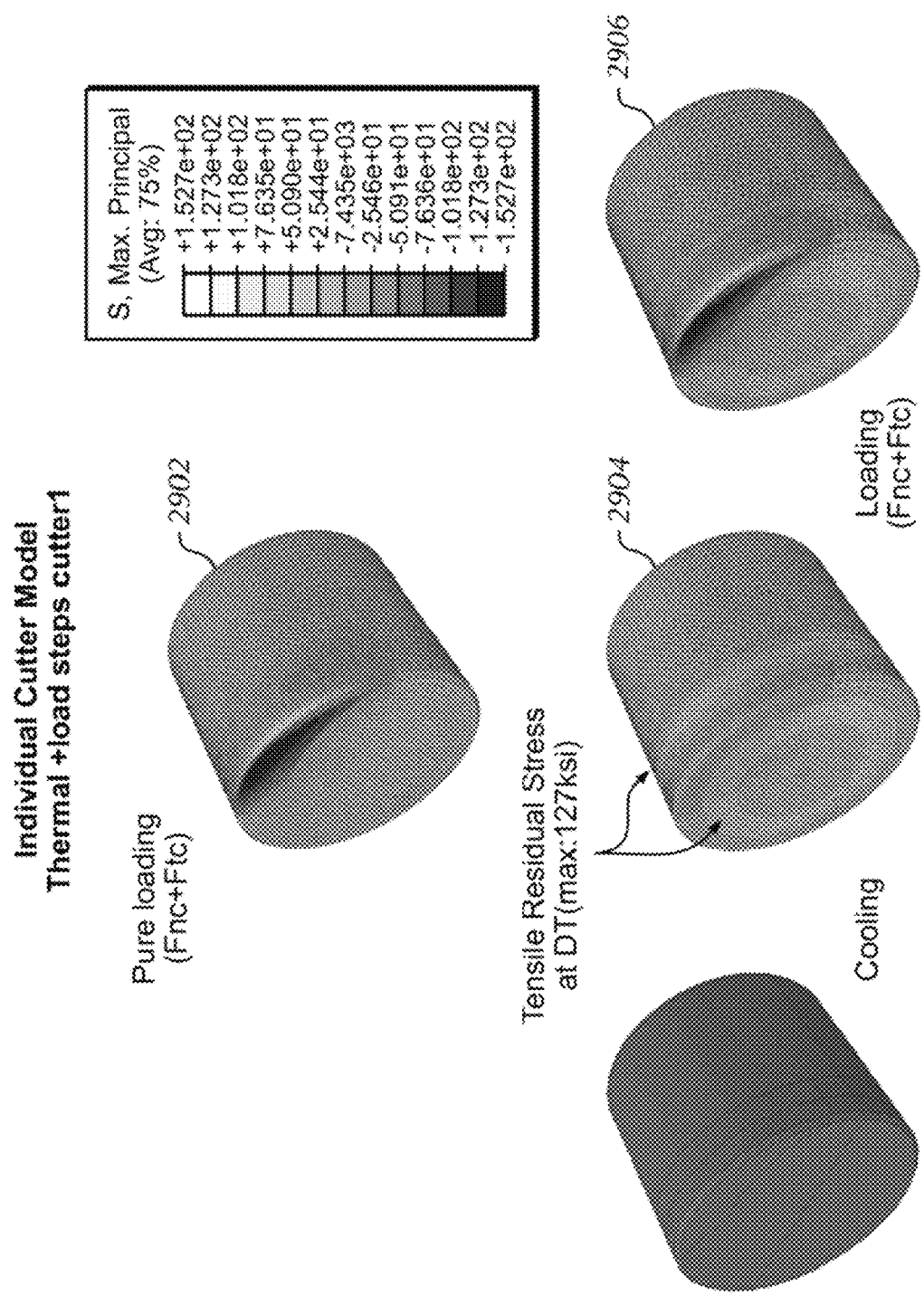
FIG. 29 shows an example individual cutter model including thermal stresses.
Figure 30:
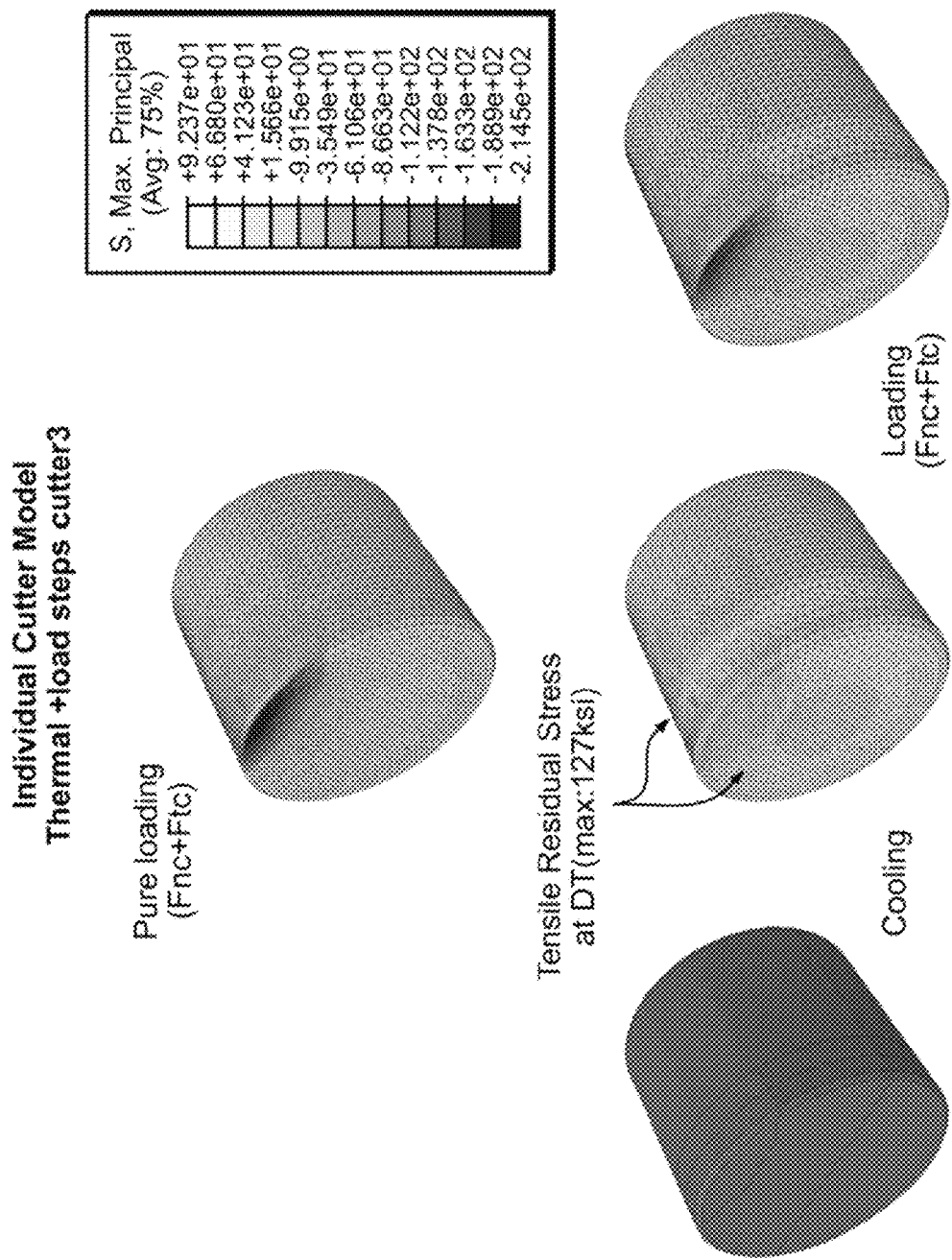
FIG. 30 shows an example individual cutter model including thermal stresses.
Figure 31:
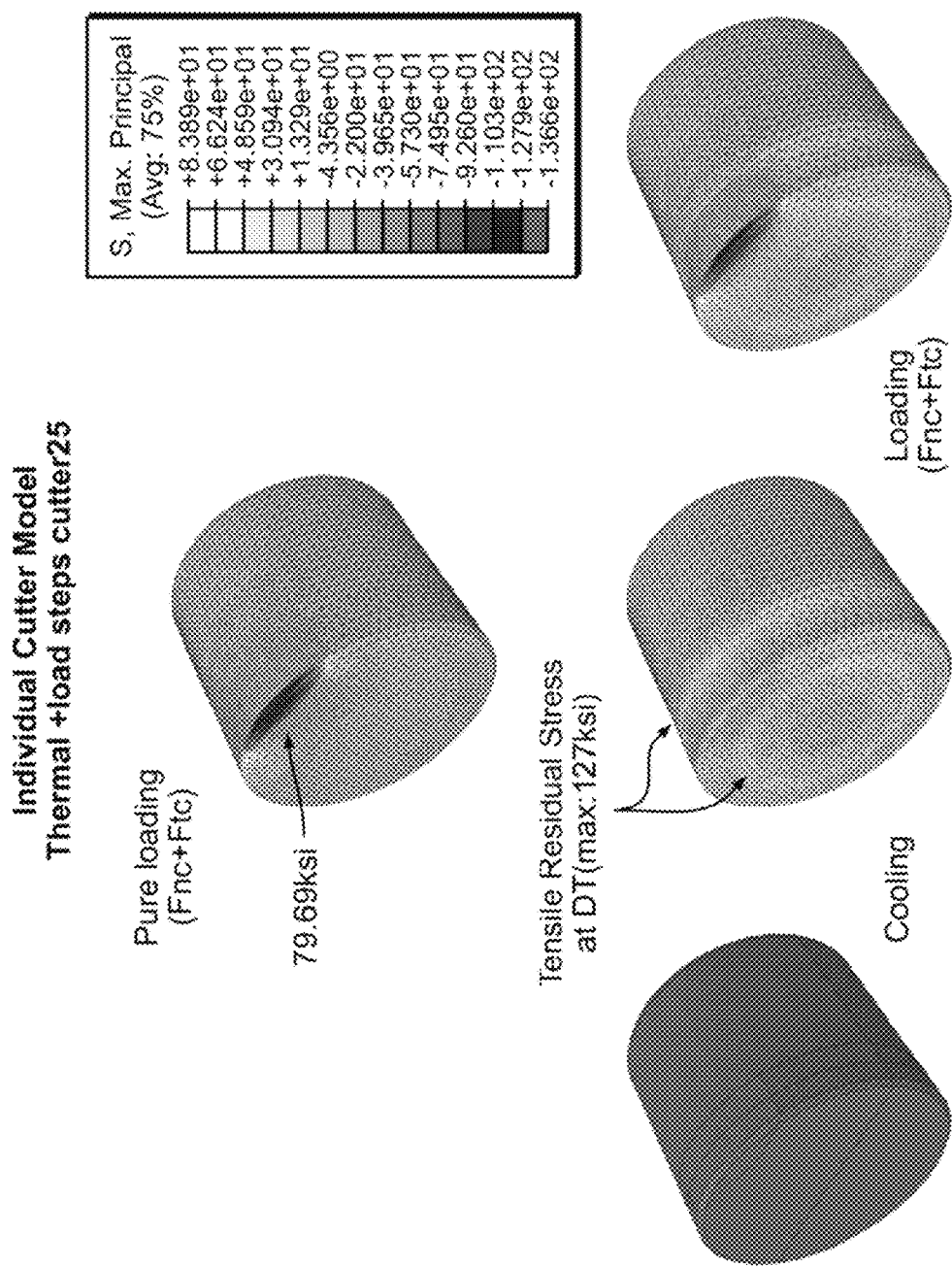
FIG. 31 shows an example individual cutter model including thermal stresses.
Figure 32:
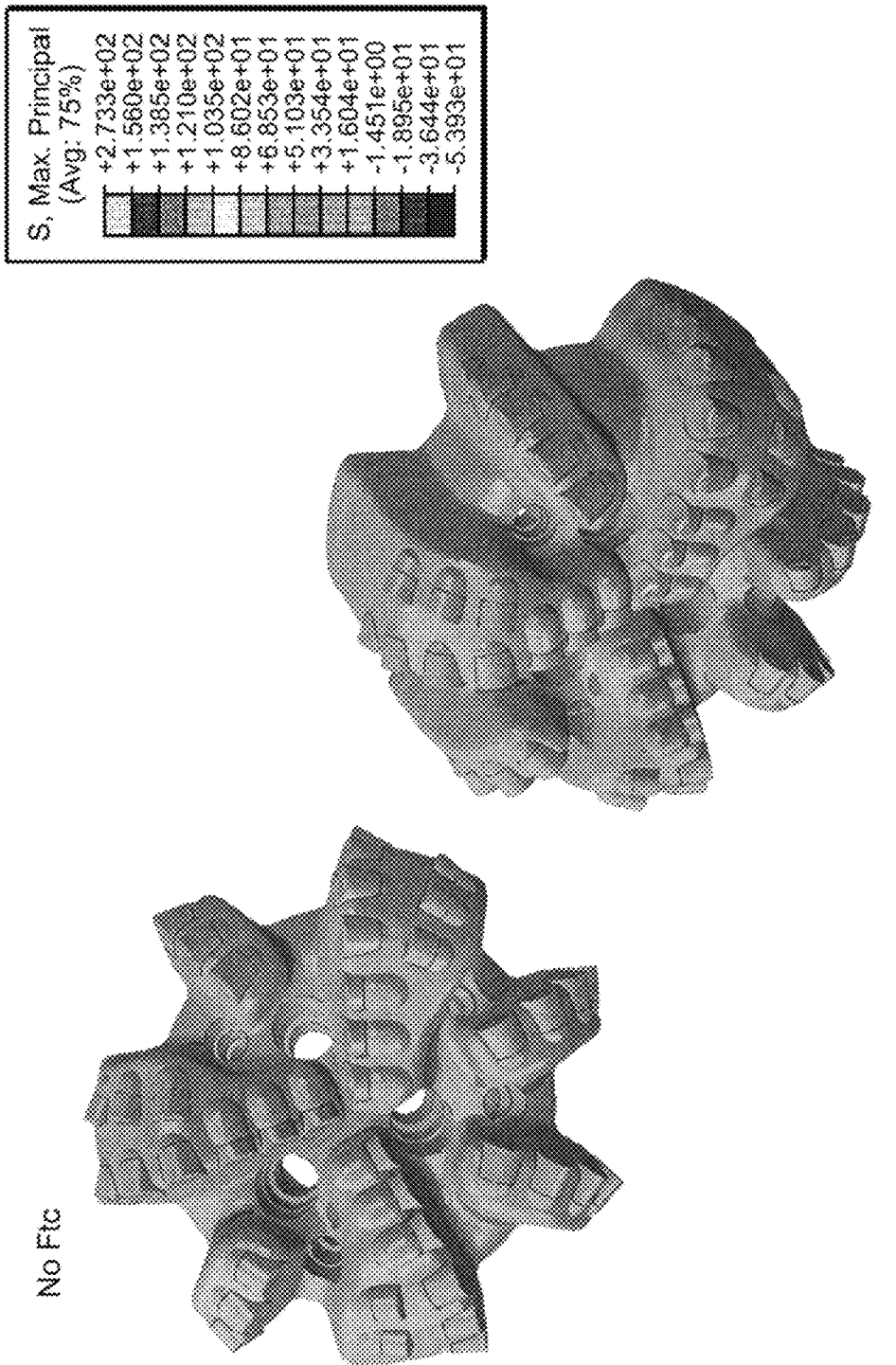
FIG. 32 shows an example of maximum principle stress on the diamond table with only one force active.
Figure 33:
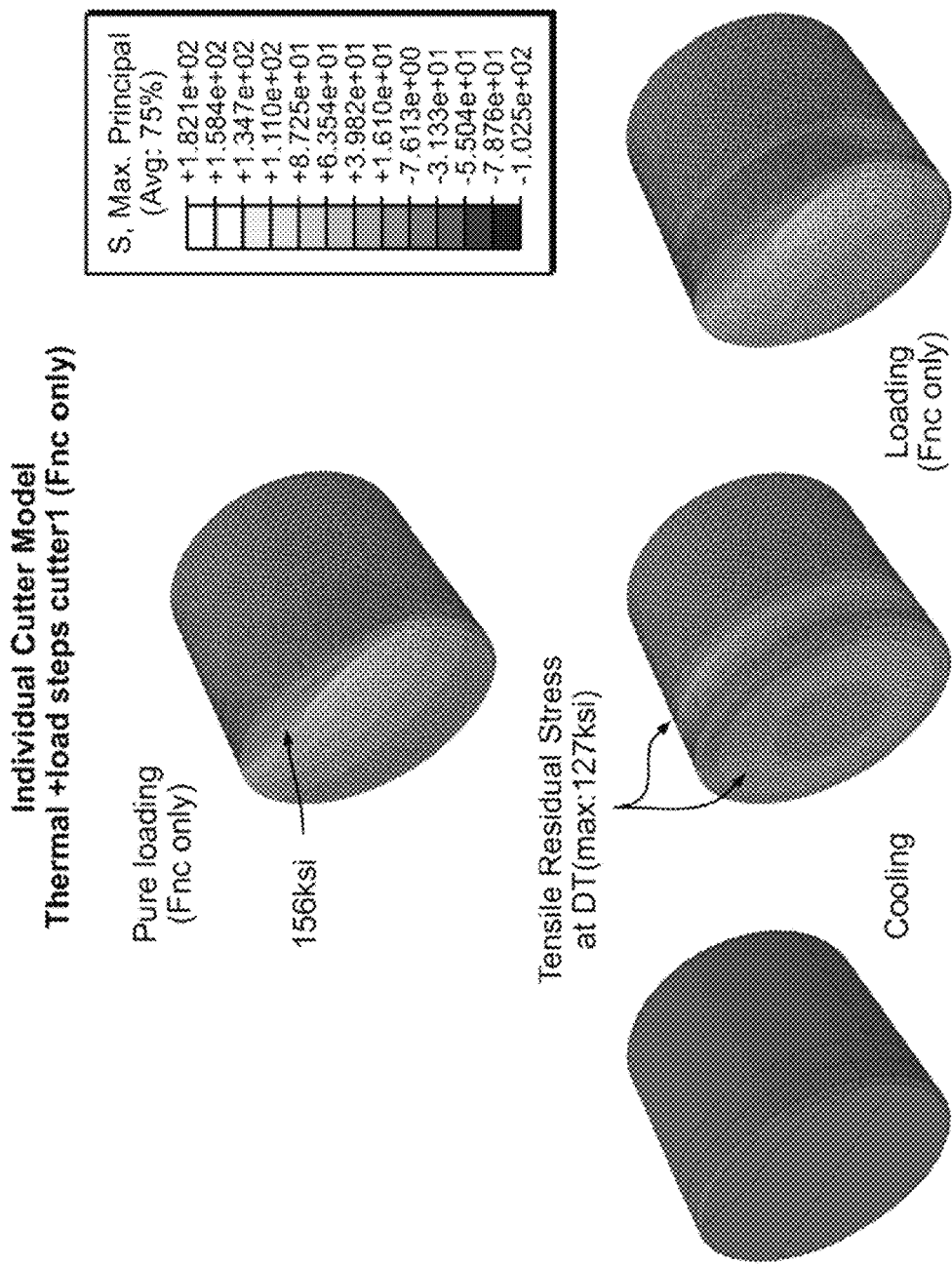
FIG. 33 shows an example individual cutter model including thermal stresses with only one force active.
Figure 34:
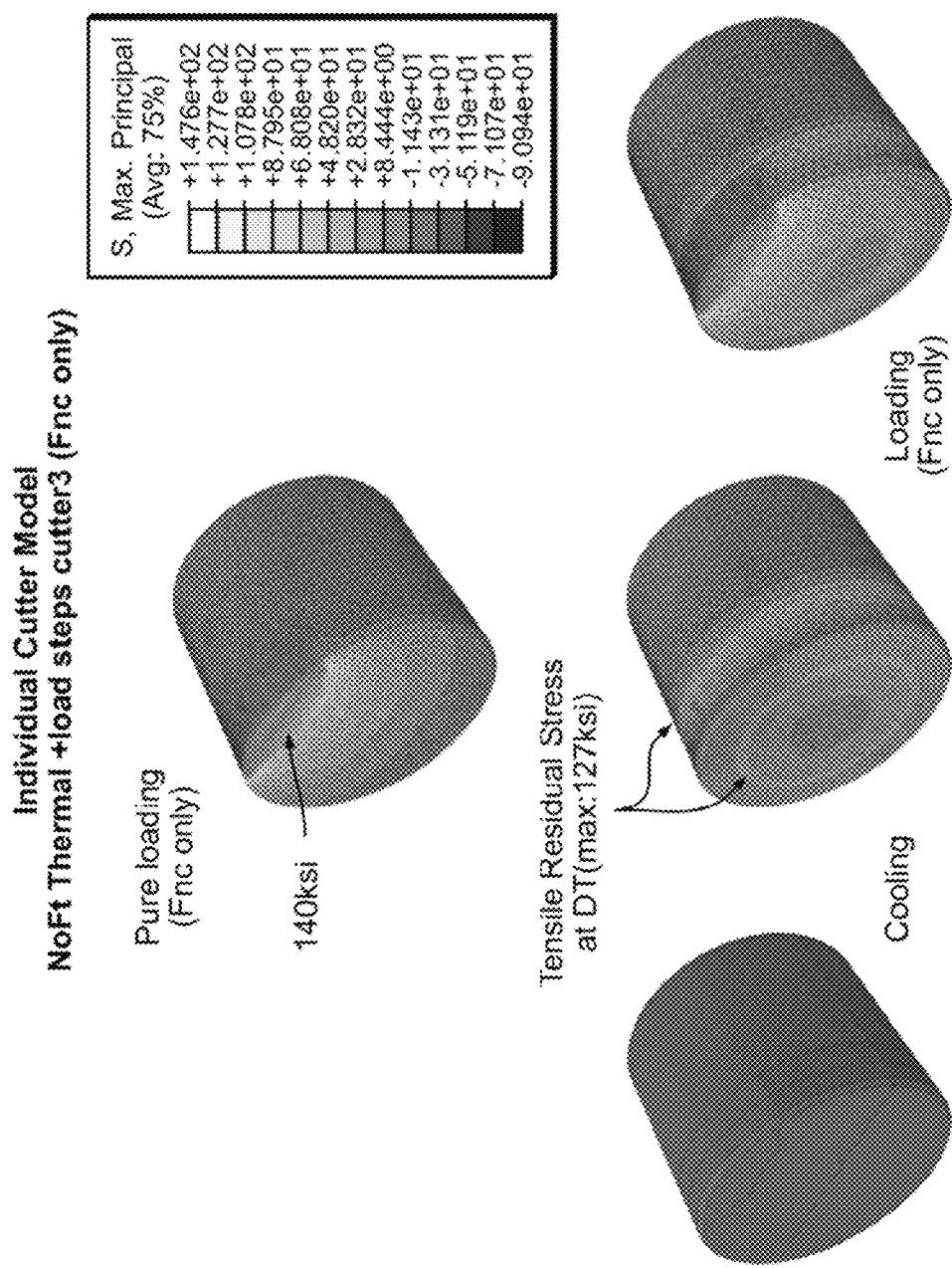
FIG. 34 shows an example individual cutter model including thermal stresses with only one force active.
Figure 35:
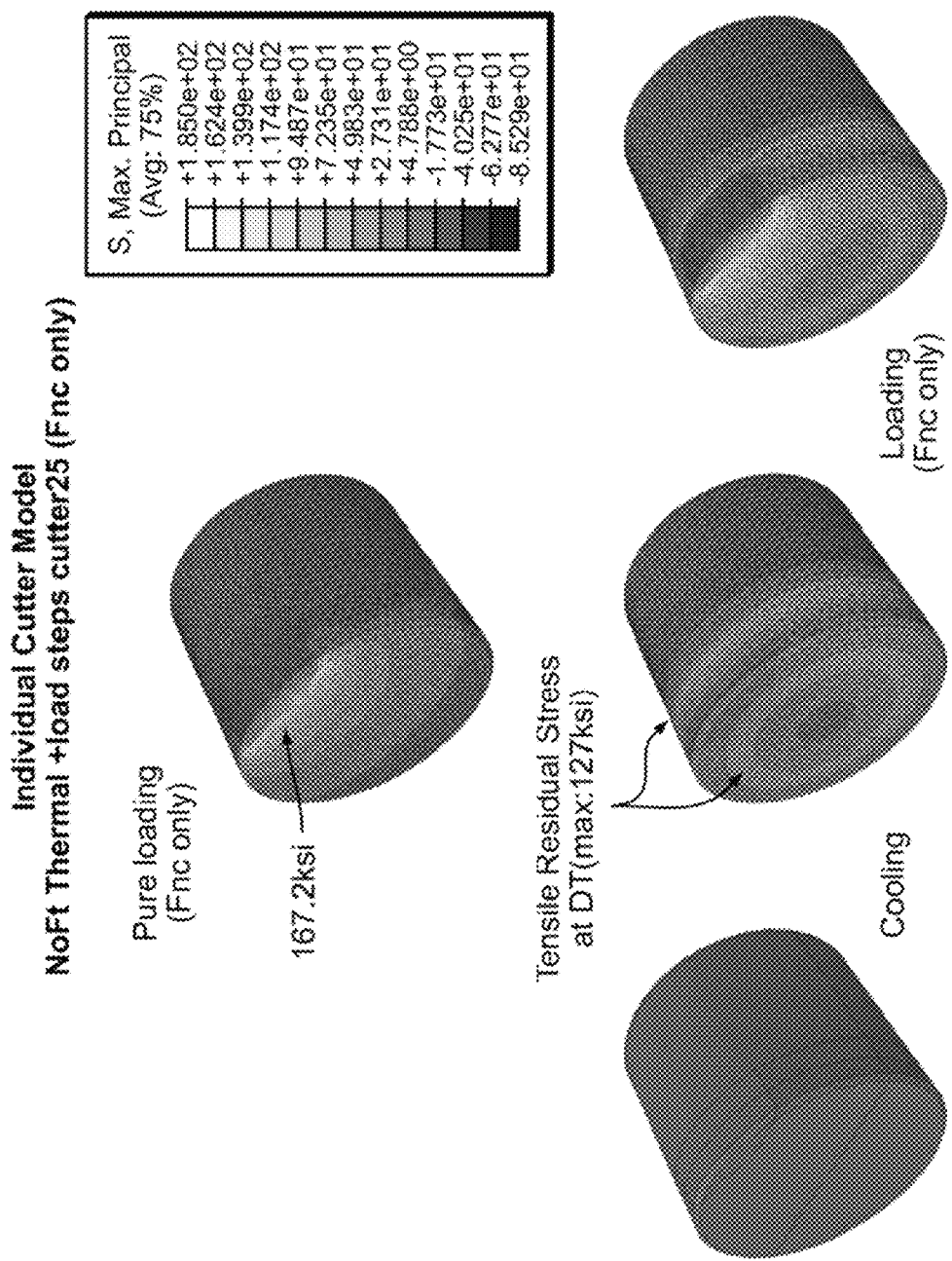
FIG. 35 shows an example individual cutter model including thermal stresses with only one force active.

Additional analysis of individual cutters can be performed using the techniques of first simulating and then performing FEA. For example, FIGS. 29-31 illustrate the FEA results of including the residual stress due to diamond table formation. In FIG. 29 for example, the stress seen by the cutter without consideration of the residual stress is shown at 2902. The residual stress is depicted at 2904. The cumulative stress, including the residual stress, is shown at 2906. As can be seen by comparing 2906 to 2902, the stress pattern has changed.

In addition, changes in the formation can be modeled in FEA by removing the $F_{tc}$ component force entirely. In FIGS. 32-35 the effect of removing, the $F_{tc}$, which simulates the transition from soil to hard formation, is shown.

By employing this technique, the structural integrity of cutters on a given bit can be estimated. The present inventors have discovered that cutter tip breakage is the major limiter of life as formation hardness increases. Cutter tip breakage can start at the cutter tip behind the bevel or at the cutter face depending on the magnitude and ratio of $F_{nc}$ and $F_{tc}$. At the core of the PDC bit, cutter breakage may initiate at cutter tip behind the bevel as weight on bit increases when drilling hard formations. In the shoulder area, cutter breakage may initiate at the cutter face due to a higher $F_{nc}/F_{tc}$ ratio. When drilling non-homogeneous formations, cracking of the cutter face is the most likely failure mode because of instantaneous high $F_{nc}$ loading. Thermal residual stress from manufacturing cooling can affect cutter diamond table stress significantly when $F_{nc}$ is the dominant force.

Designing Fixed Cutter Bits

Figure 36:
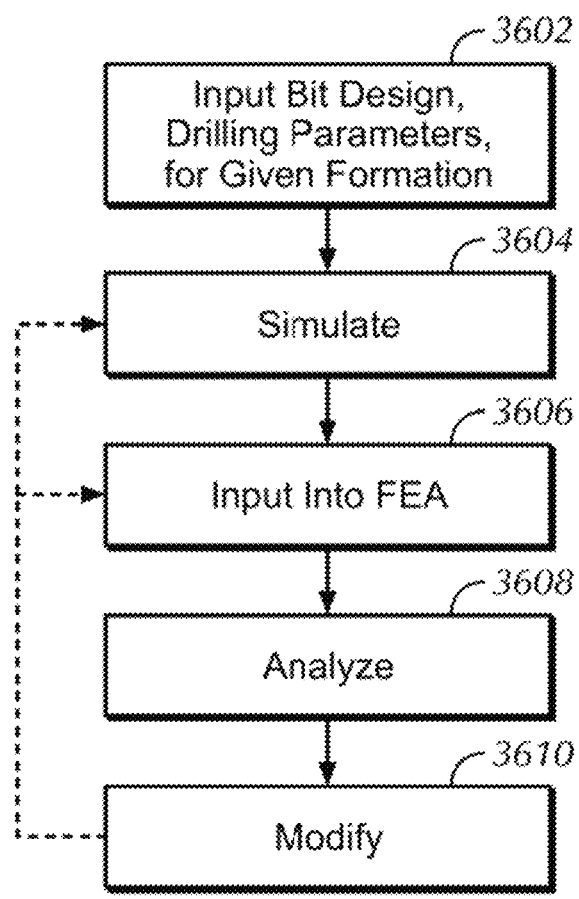
FIG. 36 shows a flowchart in accordance with an embodiment of the disclosure.

In another aspect al One or more embodiments, the disclosure provides a method for designing a fixed cutter bit. A flow chart for a method in accordance with this aspect is shown in FIG. 36. The method includes selecting bit design parameters, drilling parameters, and an earth formation to be represented as drilled, at step 3602. Then a bit having the selected bit design parameters is simulated as drilling in the selected earth formation under the conditions dictated by the selected drilling parameters, at step 3604. The simulating includes calculating the interaction between the cutters on the drill bit and the earth formation at selected increments during drilling. This includes calculating parameters for the cuts made in the formation by each of the cutters on the bit and determining the forces and the wear on each of the cutters during drilling.

The results of the simulation 3604 are been put into FEA. The Outputs from FEA are analyzed at 3608. This includes, for example, analyzing stress on various cutters. Depending upon the results of the analysis, at step 3610, at least one of the bit design parameters may be adjusted. The simulating 3604 may then be repeated for the adjusted bit design. Alternatively, the FEA 3606 may then be repeated for the adjusted bit design. The adjusting of at least one design parameter and the repeating of the simulating or FEA or both may be repeated until a desired set of bit design parameters is obtained, Once a desired set of bit parameters is obtained, the desired set of bit parameters can be used for an actual drill bit design.

A set of bit design parameters may be determined to be a desired set when the drilling performance determined for the bit is selected as acceptable. In one implementation, the drilling performance may be determined to be acceptable when the calculated stress on a given cutter is less than or equal to a selected amount.

Embodiments of the disclosure similar to the method shown in FIG. 36 can be adapted and used to analyze relationships between bit design parameters and the drilling performance of a bit. Embodiments of the disclosure similar to the method shown in FIG. 36 can also be adapted and used to design fixed cutter drill bits having enhanced drilling, characteristics, such as faster rates of penetration, more even wear on cutting elements, or a more balanced distribution of force on the cutters or the blades of the bit. Methods in accordance with this aspect of the disclosure can also be used to determine optimum locations or orientations for cutters on the bit, such as to balance forces on the bit or to optimize the drilling performance (rate of penetration, useful life, etc.) of the bit.

An optimal set of bit design parameters may be defined as a set of bit design parameters which produces a desired degree of improvement in drilling performance, in terms of rate of penetration, cutter wear, optimal axial force distribution between blades, between individual cutters, and/or optimal lateral forces distribution on the bit. For example, in one case, a design fix a bit may be considered optimized when the resulting lateral force on the bit is substantially zero or less than 1% of the weight on bit.

Drilling characteristics use to determine whether drilling performance is improved by adjusting bit design parameters can be provided as output and analyzed upon completion of each simulation or design loop. Drilling characteristics considered may include, the rate of penetration (ROP) achieved during drilling, the distribution of axial forces on cutters, etc. The information provided as output for one or more embodiments may be in the form of a visual display on a computer screen of data characterizing the drilling performance of each bit, data summarizing the relationship between bit designs and parameter values, data comparing drilling performances of the bits, or other information as determined by the system designer. The form in which the output is provided is a matter of convenience for a system designer or operator, and is not a limitation of the present disclosure.

In one or more other embodiments, instead of adjusting bit design parameters, the method may be modified to adjust selected drilling parameters and consider their effect on the drilling performance of a selected bit design, as illustrated in FIG. 36. Similarly, the type of earth formation being drilled may be changed and the simulating repeated for different types of earth formations to evaluate the performance of the selected bit design in different earth formations.

As set forth above, one or more embodiments of the disclosure can be used as a design tool to optimize the performance of fixed cutter bits drilling earth formations. One or more embodiments of the disclosure may also enable the analysis of drilling characteristics for proposed bit designs prior to the manufacturing of bits, thus, minimizing or eliminating the expense of trial and error designs of bit configurations. Further, the disclosure permits studying the effect of bit design parameter changes on the drilling characteristics of a bit and can be used to identify bit design which exhibit desired drilling characteristics. Further, use of one or more embodiments of the disclosure may lead to more efficient designing of fixed cutter drill bits having enhanced performance characteristics.

The disclosure has been described with respect to preferred embodiments. It will be apparent to those skilled in the art that the foregoing description is only an example of embodiments of the disclosure, and that other embodiments of the disclosure can be devised which do not depart from the spirit of the disclosure as disclosed herein. Accordingly, the disclosure is to be limited in scope only by the attached claims.

What is claimed is:

1. A method for designing and manufacturing a fixed cutter drill bit, said method comprising:
   (i) designing a fixed cutter drill bit, wherein designing includes analyzing the fixed cutter drill bit by at least:
   (a) selecting at least one cutter;
   (b) selecting an earth formation;
   (c) simulating drilling performance of the fixed cutter drill bit having the at least one cutter thereon, wherein simulating drilling performance simulates the fixed cutter drill bit drilling the earth formation;
   (d) performing finite element analysis using outputs from the simulated drilling performance;
   (e) resolving the outputs into a component force normal to a cutter face of the at least one cutter and a component force tangent to the cutter face of the at least one cutter, wherein resolving the outputs further includes resolving the force tangent to the cutter face into a cutting frictional force on a diamond table of the at least one cutter and a tangent force applied to a bevel of the at least one cutter;
   (f) determining a stress on the at least one cutter based on the finite element analysis; and
   (g) outputting the stress on the at least one cutter; and
   (ii) manufacturing the fixed cutter drill bit following designing the fixed cutter drill bit.

2. The method of claim 1, wherein the resolved forces are modeled as linearly distributed pressure or traction along the depth of cut.

3. The method of claim 2, wherein the resolved forces are modeled as linearly distributed pressure or traction along the depth of cut.

4. The method of claim 1, wherein the resolved forces are applied to a formation/cutter interaction area resulting from the simulating.

5. The method of claim 1, wherein analyzing the fixed cutter drill bit further includes determining a predicted, non-uniform depth of cut for a plurality of cutters and outputting the stress based on the predicted depths of cut.

6. The method of claim 5, wherein analyzing the fixed cutter drill bit further includes comparing the stress resulting from non-uniform depths of cut to stress resulting from an average depth of cut.

7. The method of claim 1, wherein analyzing the fixed cutter drill bit further includes analyzing the component force normal to the cutter face of the at least one cutter without the component force tangent to the cutter face of the at least one cutter.

8. The method of claim 1, wherein the outputted stress is based on a second order distribution of forces on the at least one cutter.

9. The method of claim 1, wherein analyzing the fixed cutter drill bit further includes graphically displaying at least one aspect of the simulating.

10. A method for designing a fixed cutter drill bit, said method comprising:
   (a) selecting bit design parameters;
   (b) selecting an earth formation;
   (e) selecting drilling parameters;
   (d) simulating drilling performance of the fixed cutter drill bit having a plurality of cutters thereon, wherein simulating drilling performance simulates the fixed cutter drill bit drilling the earth formation;
   (e) performing finite element analysis using outputs from the simulated drilling performance, the finite element analysis using a non-uniform depth of cut for the plurality of cutters of the fixed cutter drill bit;
   (f) determining a stress on the plurality of cutters based on the finite element analysis;
   (g) comparing a stress of at least one cutter of the plurality of cutters based on the non-uniform depth of cut to a stress resulting from an average depth of cut;
   (h) outputting the stress on the at least one cutter; and
   (i) manufacturing the fixed cutter drill bit based on the selected bit design parameters and including the plurality of cutters.

11. The method of claim 10, further comprising adjusting at least one of the bit design parameters or at least one of the drilling parameters and repeating at least one of the simulating drilling performance or performing finite element analysis.

12. The method of claim 11, further comprising repeating the adjusting until the stress has been reduced below a selected amount.

13. The method of claim 11, further comprising repeating the adjusting until the resulting lateral force is less than 1% of the weight on bit.

14. The method of claim 10, further comprising predicting cutter failure mode based on the stress.

* * * * *